US009128570B2

(12) United States Patent
Vallis et al.

(10) Patent No.: US 9,128,570 B2
(45) Date of Patent: Sep. 8, 2015

(54) NOISE FILTERING DEVICES, SYSTEMS AND METHODS FOR CAPACITANCE SENSING DEVICES

(75) Inventors: Darrin Vallis, San Jose, CA (US); Victor Kremin, Lviv (UA); Andriy Maharyta, Lviv (UA); Yuriy Boychuk, Lviv (UA); Anton Konovalov, Khmelnytskyy (UA); Oleksandr Karpin, Lviv (UA); Ihor Musijchuk, Ostrog districe (UA); Hans Klein, San Jose, CA (US); Edward L. Grivna, Brooklyn Park, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 72 days.

(21) Appl. No.: 13/247,951

(22) Filed: Sep. 28, 2011

(65) Prior Publication Data

US 2012/0200524 A1    Aug. 9, 2012

Related U.S. Application Data

(60) Provisional application No. 61/440,327, filed on Feb. 7, 2011.

(51) Int. Cl.
*G06F 3/044* (2006.01)
*G01R 29/26* (2006.01)
*H04B 1/04* (2006.01)

(52) U.S. Cl.
CPC ............... *G06F 3/044* (2013.01); *G01R 29/26* (2013.01); *H04B 1/0475* (2013.01)

(58) Field of Classification Search
CPC ....... G06F 3/045; G06F 3/044; H04B 1/0475; H04B 1/10–1/14; G01R 29/26

USPC .................... 345/173–178; 178/18.01–20.04
See application file for complete search history.

(56) References Cited

U.S. PATENT DOCUMENTS

| 6,215,477 | B1 | 4/2001 | Morrison et al. |
| 6,624,835 | B2 | 9/2003 | Willig |
| 6,734,843 | B2 | 5/2004 | Bertram et al. |
| 8,027,743 | B1 | 9/2011 | Johnston |
| 2005/0122119 | A1 | 6/2005 | Barlow |

(Continued)

FOREIGN PATENT DOCUMENTS

| KR | 1020080013638 | 2/2008 |
| KR | 10200800391251 | 5/2008 |
| KR | 1020100040518 | 4/2010 |

OTHER PUBLICATIONS

International Search Report/Written Opinion for Application No. PCT/US2011/053754 dated Mar. 28, 2012, 3 pages.
Atmel: New Generation of maXTouch Solutions, http://www.radiolocman.com/review/article.html?di=78863, Feb. 21, 2011; 3 pages.
ST FingerTip Touchscreen technology stifles electrical 'noise'; EETimes; Jun. 16, 2011; 4 pages.

(Continued)

*Primary Examiner* — Ryan A Lubit
*Assistant Examiner* — Yaron Cohen

(57) ABSTRACT

A capacitance sensing system can filter noise that presents in a subset of electrodes in the proximity of a sense object (i.e., finger). A capacitance sensing system can include a sense network comprising a plurality of electrodes for generating sense values; a noise listening circuit configured to detect noise on a plurality of the electrodes; and a filtering circuit that enables a filtering for localized noise events when detected noise values are above one level, and disables the filtering for localized noise events when detected noise values are below the one level.

17 Claims, 14 Drawing Sheets

(56) References Cited

U.S. PATENT DOCUMENTS

| | | | |
|---|---|---|---|
| 2006/0103635 A1 | 5/2006 | Park | |
| 2006/0267953 A1* | 11/2006 | Peterson et al. | 345/173 |
| 2008/0285773 A1 | 11/2008 | Nongpiur et al. | |
| 2009/0002343 A1 | 1/2009 | Land et al. | |
| 2009/0228272 A1 | 9/2009 | Herbig et al. | |
| 2010/0060610 A1 | 3/2010 | Wu | |
| 2010/0079401 A1 | 4/2010 | Staton | |
| 2010/0079402 A1 | 4/2010 | Grunthaner et al. | |
| 2010/0097078 A1 | 4/2010 | Philipp et al. | |
| 2010/0172510 A1 | 7/2010 | Juvonen | |
| 2010/0292945 A1* | 11/2010 | Reynolds et al. | 702/65 |
| 2011/0061947 A1* | 3/2011 | Krah et al. | 178/18.01 |
| 2011/0115729 A1 | 5/2011 | Kremin et al. | |
| 2011/0120784 A1* | 5/2011 | Osoinach et al. | 178/18.06 |
| 2011/0157067 A1 | 6/2011 | Wagner et al. | |
| 2011/0157077 A1* | 6/2011 | Martin et al. | 345/174 |
| 2011/0254802 A1* | 10/2011 | Philipp | 345/174 |
| 2012/0013565 A1* | 1/2012 | Westhues et al. | 345/174 |
| 2012/0056841 A1* | 3/2012 | Krenik et al. | 345/174 |
| 2012/0062474 A1* | 3/2012 | Weishaupt et al. | 345/173 |

OTHER PUBLICATIONS

U.S. Appl. No. 13/309,674: "Noise Detection For A Capacitance Sensing Panel", Hans Van Antwerpen et al., filed Dec. 2, 2011; 51 pages.

U.S. Appl. No. 13/436,535: "Method and Apparatus for Automating Noise Reduction Tuning in Real Time", Erik Anderson et al., filed Mar. 30, 2012; 56 pages.

J.H. Yang, et al. "A Novel Readout IC with High Noise Immunity for Charge-Based Touch Screen Panels", dated 2010; 4 pages.

Search Report for U.S. Appl. No. 13/436,535, Dated Mar. 2012, 18 pages.

Seunghoon Ko, et al. "Low Noise Capacitive Sensor for Multi-touch Mobile Handset's Applications", dated Nov. 8, 2010; 4 pages.

Susan Pratt, "Using the Noise Reduction Feature on the AD7877", 4 pages.

Wendy Fang, "Reducing Analog Input Noise in Touch Screen Systems"; dated Jul. 2007; 12 pages.

Written Opinion of the International Searching Authority for International Application No. PCT/US11/53754 dated Mar. 28, 2012; 4 pages.

* cited by examiner

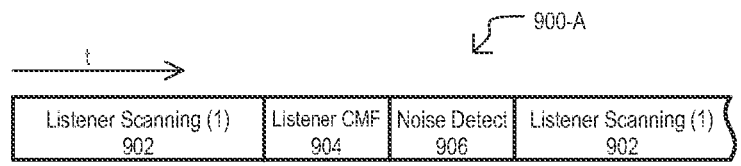
FIG. 9A
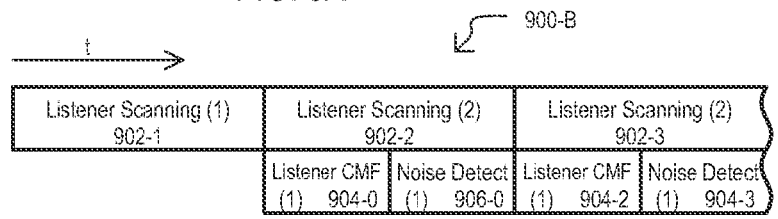
FIG. 9B
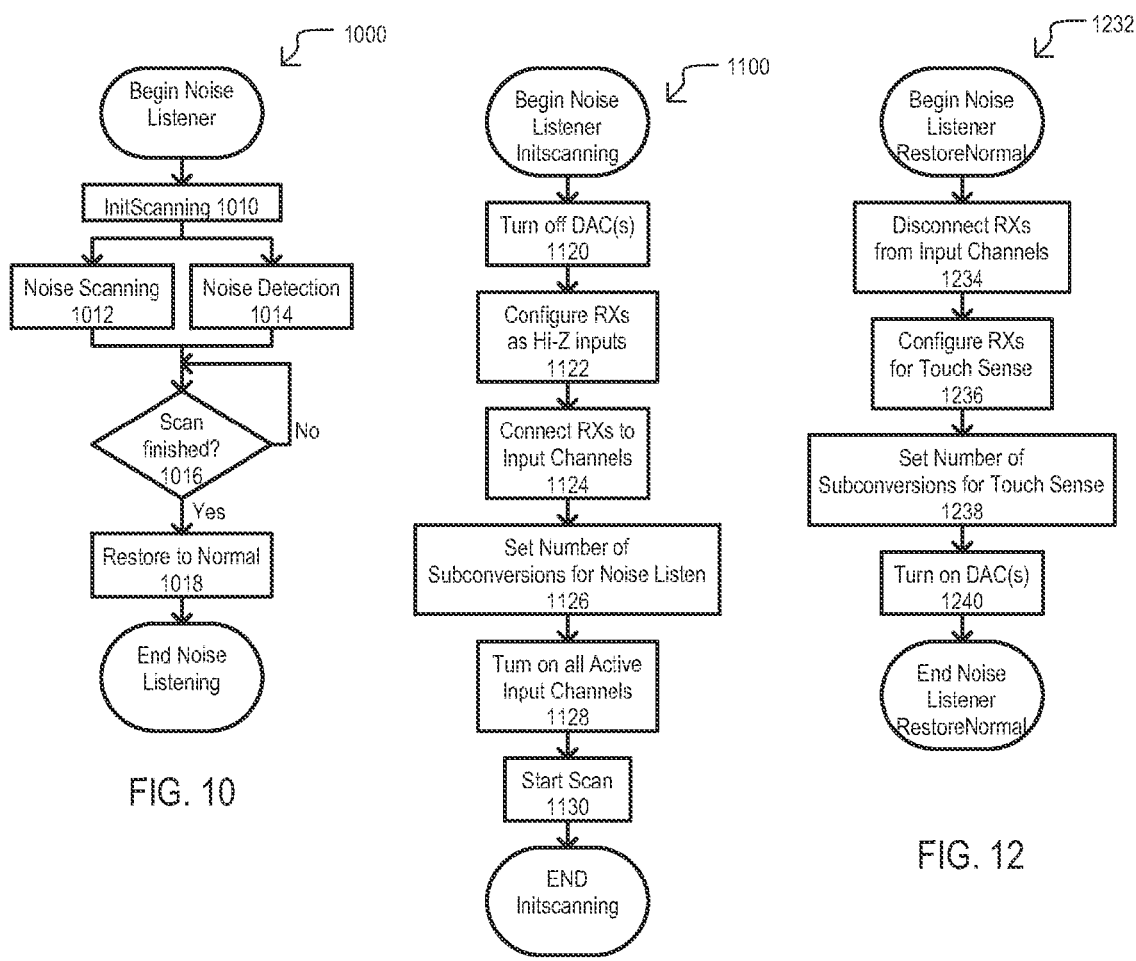
FIG. 10
FIG. 11
FIG. 12

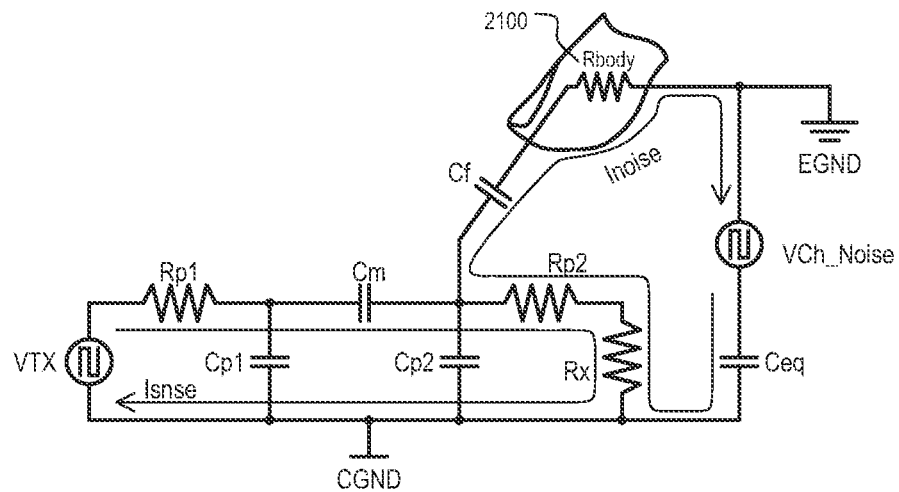
FIG. 21 (BACKGROUND)
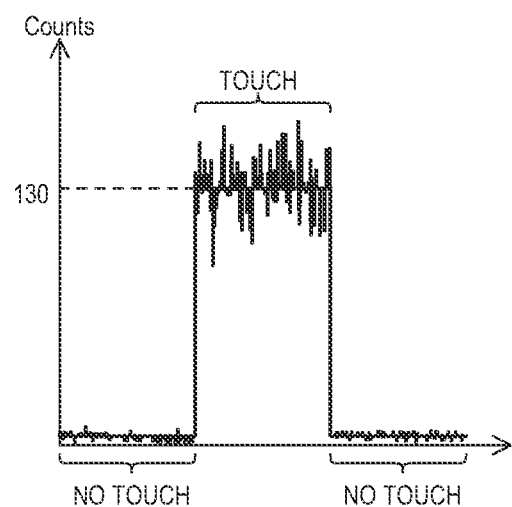
FIG. 22 (BACKGROUND)

ized as including "internal" noise and "external noise". Internal noise can be noise that can affect an entire system at the same time. Thus, internal noise can appear on all electrodes at the same time. That is, internal noise can be a "common" mode type noise with respect to the sensors (e.g., electrodes) of a system. Sources of internal noise can include, but are not limited to: sensor power supply noise (noise present on a power supply provided to the capacitance sensing circuit) and sensor power generation noise (noise arising from power generating circuits, such as charge pumps, that generate a higher magnitude voltage from a lower magnitude voltage).

NOISE FILTERING DEVICES, SYSTEMS AND METHODS FOR CAPACITANCE SENSING DEVICES

This application claims the benefit of U.S. Provisional Patent Application Ser. No. 61/440,327, filed on Feb. 2, 2011, the contents of which are incorporated by reference herein.

TECHNICAL FIELD

The present disclosure relates generally to capacitance sensing systems, and more particularly to noise filtering in such systems.

BACKGROUND

Capacitance sensing systems can sense electrical signals generated on electrodes that reflect changes in capacitance. Such changes in capacitance can indicate a touch event (i.e., the proximity of an object to particular electrodes). Electrical sense signals can be degraded by the presence of noise.

Noise in capacitance sensing systems can be conceptualized as including "internal" noise and "external noise". Internal noise can be noise that can affect an entire system at the same time. Thus, internal noise can appear on all electrodes at the same time. That is, internal noise can be a "common" mode type noise with respect to the sensors (e.g., electrodes) of a system. Sources of internal noise can include, but are not limited to: sensor power supply noise (noise present on a power supply provided to the capacitance sensing circuit) and sensor power generation noise (noise arising from power generating circuits, such as charge pumps, that generate a higher magnitude voltage from a lower magnitude voltage).

In touchscreen devices (i.e., devices having a display overlaid with a capacitance sensing network), a display can give rise to internal noise. As but a few examples, display noise sources can include, but are not limited to: LCD VCOM noise (noise from a liquid crystal display that drives a segment common voltage between different values), LCD VCOM coupled noise (noise from modulating a thin film transistor layer in an LCD device that can be coupled through a VCOM node), and display power supply noise (like sensor power generation noise, but for power supplied of the display).

Common mode type noise can be addressed by a common mode type filter that filters out noise common to all electrodes in a sense phase.

External noise, unlike internal noise, can arise from charge coupled by a sensed object (e.g., finger or stylus), and thus can be local to a touch area. Consequently, external noise is typically not common to all electrodes in a sense phase, but only to a sub-set of the electrodes proximate to a touch event.

Sources of external noise can include charger noise. Charger noise can arise from charger devices (e.g., battery chargers that plug into AC mains, or those that plug into automobile power supplies). Chargers operating from AC mains can often include a "flyback" transform that can create an unstable device ground with respect to "true" ground (earth ground). Consequently, if a user at earth ground touches a capacitance sense surface of a device while the device is connected to a charger, due to the varying device ground, a touch can inject charge at a touch location, creating a localized noise event.

Other sources of external noise can arise from various other electrical fields that can couple to a human body, including but not limited to AC mains (e.g., 50/60 Hz line voltage), fluorescent lighting, brushed motors, arc welding, and cell phones or other radio frequency (RF) noise sources. Fields from these devices can be coupled to a human body, which can then be coupled to a capacitance sensing surface in a touch event.

FIG. 21 is a schematic diagram of model showing charger noise in a conventional mutual capacitance sensing device. A voltage source VTX can be a transmit signal generated on a TX electrode, Rp1 can be a resistance of a TX electrode, Cp1 can be (self) capacitance between a TX electrode and device ground (which can be a charger ground CGND), Cm can be a mutual capacitance between a TX electrode and a receive (RX) electrode, Cp2 can be a self-capacitance of an RX electrode, Rp2 can be a resistance of a RX electrode. Rx can represent an impedance of a capacitance sensing circuit.

Cf can be a capacitance between a sense object 2100 (e.g., finger). A voltage source VCh_Noise can represent noise arising from differences between CGND and earth ground (EGND). Voltage source VCh_Noise can be connected to a device ground by an equivalent capacitance Ceq.

As shown in FIG. 21, a sense current (Isense) can be generated in response to source VTX that can vary in response to changes in Cm. However, at the same time, a noise current (Inoise) can arise a touch event, due to the operation of a charger. A noise current (Inoise) can be additive and subtractive to an Isense signal, and can give rise to erroneous sense events (touch indicated when no touch occurs) and/or erroneous non-sense events (touch not detected).

FIG. 22 shows capacitance sense values (in this case counts) corresponding to non-touch and touch events in a conventional system subject to external noise. As shown, while a device is not touched (NO TOUCH) noise levels are relatively small. However, while a device is touched (TOUCH) noise levels at the touch location are considerably higher.

While capacitance sensing systems can include common mode type filtering, such filtering typically does not address the adverse affects of external noise, as such noise is not present on all electrodes, but rather localized to electrodes proximate a sense event.

BRIEF DESCRIPTION OF THE DRAWINGS

FIGS. 9A and 9B are diagrams showing noise listening operations according to an embodiment.

FIG. 10 is a flow diagram of a noise listening operation according to an embodiment.

FIG. 11 is a flow diagram of a noise listening scan initialization operation according to an embodiment.

FIG. 12 is a flow diagram of a noise listening restore-to-normal operation according to an embodiment.

FIG. 21 is a schematic diagram showing charger noise in a conventional mutual capacitance sensing device.

FIG. 22 shows capacitance sense values with external noise corresponding to non-touch and touch events in a conventional system.

DETAILED DESCRIPTION

Figure 1:
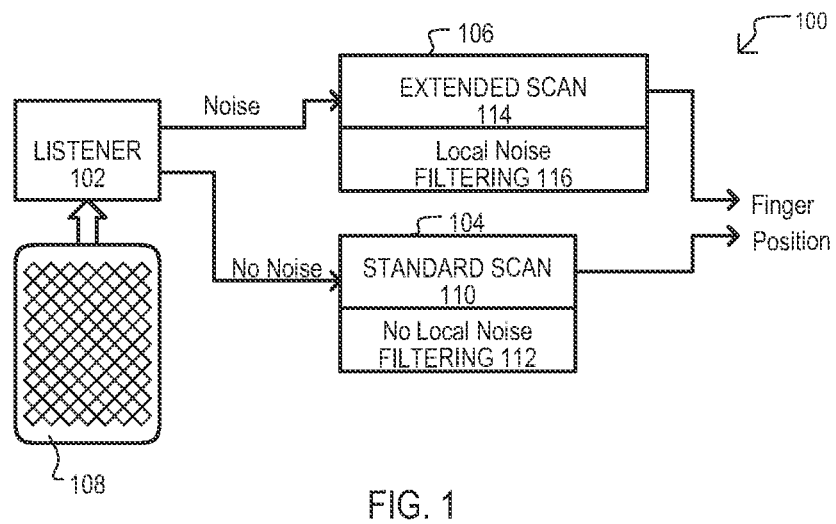
FIG. 1 is a flow diagram of a capacitance sensing operation according to an embodiment.

Various embodiments will now be described that show capacitance sensing systems and methods that listen for noise and alter filtering of sensed values according to a noise level. In particular embodiments, if noise levels are below a certain threshold, indicating the absence of (or low levels of) external noise (i.e., noise localized to a touch area), sensed values can be filtered for common mode type noise. However, if noise levels are above the threshold, sensed valued can be filtered to account for external noise. In particular embodiments, filtering for localized noise can include a median filter.

In the embodiments below, like items are referred to by the same reference character but with the leading digit(s) corresponding to the figure number.

FIG. 1 shows a flow diagram of a capacitance sensing system operation 100 according to one embodiment. A system operation 100 can include a listening operation 102, a no local noise processing path 104, and a local noise processing path 106. A listening operation 102 can monitor a sense network 108 for noise. A sense network 108 can include multiple electrodes for sensing a capacitance in a sensing area. In a particular embodiment, a sense network 108 can be a mutual capacitance sensing network having transmit (TX) electrodes that can be driven with a transmit signal, and receive (RX) electrodes coupled to the TX electrodes by a mutual capacitance.

In some embodiments, a listening operation 102 can use the same electrodes used for capacitance sensing (e.g., touch position detection) for noise detection. In a very particular embodiment, a listening operation 102 can monitor all RX electrodes for noise. In an alternate embodiment, a listening operation 102 can monitor all RX electrodes in a noise listening operation. In yet another embodiment, a listening operation 102 can monitor both TX and RX electrodes in a listening operation.

A listening operation 102 can compare detected noise to one or more threshold values to make a determination on the presence of noise. If noise is determined to be present (Noise), a local noise processing path 106 can be followed. In contrast, if no noise is determined to be present (No Noise), a no local noise processing path 104 can be followed.

Processing paths 104 and 106 show how sense signals derived from sense network 108 can be acquired and filtered. A no local noise processing path 104 can acquire sense values from a sense network 108 with a standard scan 110 and non-local filtering 112. A standard scan 110 can sample electrode values to generate sense values using a set number of sample operations and/or a set duration. Non-local filtering 112 can provide filtering that is not directed at local noise events, such as those arising from external noise. In particular embodiments, non-local filtering 112 can include common mode type filtering that filters for noise common to all sense electrodes.

A local noise processing path 106 can address the adverse affects of local noise, like that arising from external noise. A local noise processing path 106 can acquire sense values from a sense network 108 with an extended scan 114 and local filtering 116. An extended scan 114 can sample electrode values with a larger number of sample operations and/or a longer duration than the standard scan 110. In addition, local filtering 116 can provide filtering to remove local noise events, such as those arising from external noise. In particular embodiments, local filtering 116 can include median filtering.

In this way, in response to the detection of noise, a processing of capacitance sense signals can switch from a standard scan time and non-local filtering to an increased scan time and local filtering.

Figure 2:
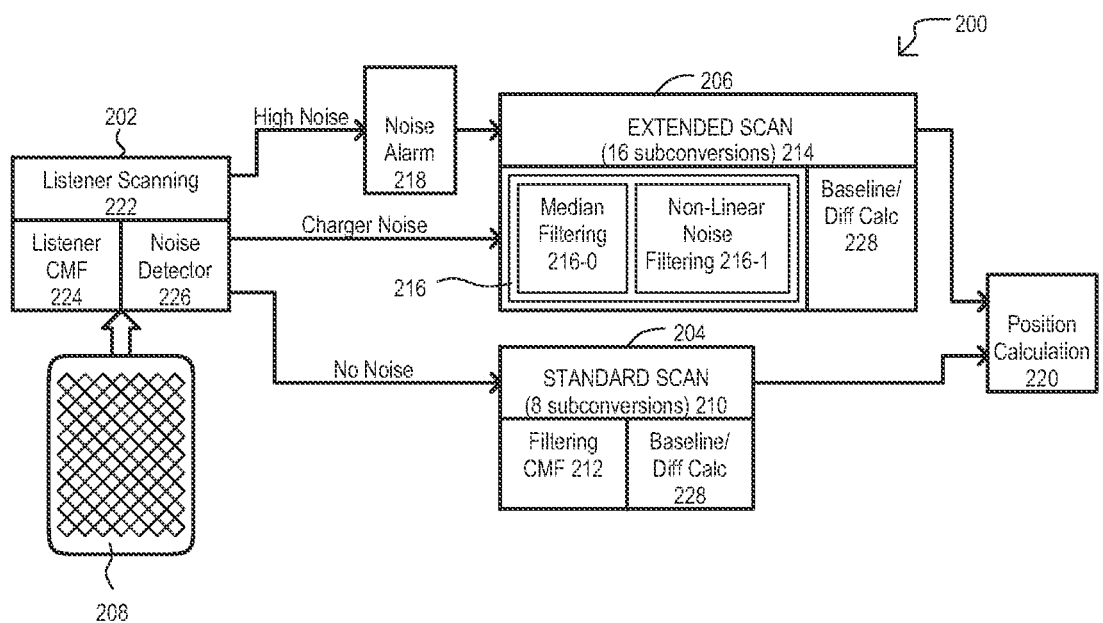
FIG. 2 is a flow diagram of a capacitance sensing operation according to another embodiment.

FIG. 2 shows a flow diagram of a capacitance sensing system operation 200 according to another embodiment. In one particular embodiment, system operation 200 can be one implementation of that shown in FIG. 1. In addition to items like those shown in FIG. 1, FIG. 2 further shows a noise alarm operation 218 and touch position calculation operation 220.

In the embodiment shown, a listening operation 202 can include listener scanning 222, listener common mode filtering (CMF) 224, and noise detection 226. Listener scanning 222 can include measuring signals on multiple electrodes of sense network 208. Scanning (noise signal acquisition) times can be selected based on sense network and expected noise source(s). A listener CMF 224 can filter for noise common to all electrodes being scanned. Such filtering can enable external type noise (noise local to a subset of the scanned electrodes) to pass through for noise detection 226.

Noise detection 226 can establish whether any detected noise exceeds one or more thresholds. In the embodiment shown, if noise is below a first threshold, noise detection 226 can activate a "No Noise" indication. If noise is above a first threshold, noise detection 226 can activate a "Noise" indication. If noise is above a second threshold, greater than the first threshold, noise detection 226 can activate a "High Noise" indication.

In the case of a "No Noise" indication, processing can proceed according to no local noise processing path 204. Such a processing path 204 can utilize a standard scanning 210, which in the particular embodiment shown can include 8 subconversions per electrode. A subconversion can be an elementary signal conversion event, and can reflect demodulation and/or integration results for one or more full input signal periods. Such processing can further include a CMF filtering 212 of values sensed on multiple electrodes. Such values can then be subject to baseline and difference calculations 228, which can determine and difference between current sense values and baseline values. A sufficiently large difference can indicate a touch event.

In the case of a "Noise" indication, processing can proceed according to local noise processing path 206. Local noise processing 206 can increase signal acquisition time with an extended scanning 214 that utilizes 16 subconversion (i.e., doubles a scanning time versus the no noise case). A processing path 206 can further include non-CMF filtering 216 that can filter for external noise events affecting a local set of electrodes. In the particular embodiment shown, non-CMF filtering 216 can include median filtering 216-0 and non-linear filtering 216-1. Resulting filtered sense values can then be subject to baseline and difference calculations 228, like that described for the no local noise processing path 204.

In the case of a "High Noise" indication, processing can include activation of an alarm indication 218. An alarm indication 218 can inform a user and/or a system that noise levels are high enough to result in erroneous capacitance sensing results. In a very particular embodiment, such a warning can be a visual warning on a display associated with the sense network 208 (e.g., a touchscreen display). However, warnings may include various other indication types, including but not limited to: a different type of visual alarm (e.g., LED), an audio alarm, or a processor interrupt, to name just a few. In the embodiment of FIG. 2, in response to a "High Noise" indication, processing may also proceed according to local noise processing path 206. However, in other embodiments, capacitance sense processing could be interrupted, or additional filtering or signal boosting could occur.

Operation 200 can also include touch position calculations 220. Such actions can derive positions of touch events from sense values generated by processing paths 204 and 206. Touch position values generated by calculations 220 can be provided to a device application, or the like.

In this way, a listening circuit can include common mode filtering of sense electrodes to listen for localized noise events, such as external noise from a device charger or the like. Sense signals can be filtered based on sensed noise values and/or an alarm can be triggered if noise levels exceed a high threshold value.

Figure 3:
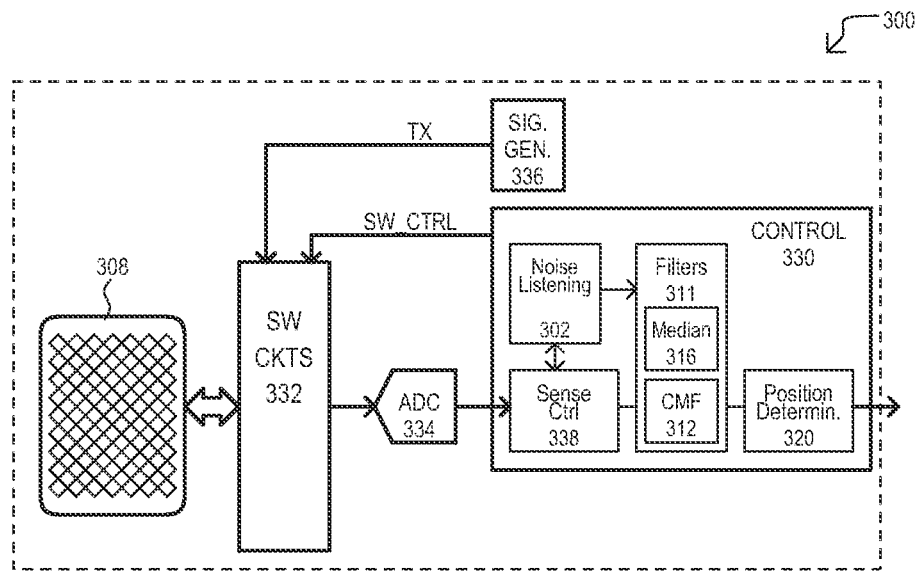
FIG. 3 is a block schematic diagram of a capacitance sensing system according to an embodiment.

Referring now to FIG. 3, a capacitance sensing system according to an embodiment is shown in a block schematic diagram and designated by the general reference character 300. A system 300 can include a sense network 308, switch circuits 332, an analog-to-digital converter (ADC) 334, a signal generator 336, and a controller 330. A sense network 308 can be any suitable capacitance sense network, including a mutual capacitance sensing network, as disclosed herein. A sense network 308 can include multiple sensors (e.g., electrodes) for sensing changes in capacitance.

Switch circuits 332 can selectively enable signal paths, both input and output signal paths, between a sense network 308 and a controller 330. In the embodiment shown, switch circuits 332 can also enable a signal path between a signal generator 336 and sense network 308.

An ADC 334 can convert analog signals received from sense network 308 via switching circuits 308 into digital values. An ADC 334 can be any suitable ADC, including but not limited to a successive approximation (SAR) ADC, integrating ADC, sigma-delta modulating ADC, and a "flash" (voltage ladder type) ADC, as but a few examples.

A signal generator 336 can generate a signal for inducing sense signals from sense network 308. As but one example, a signal generator 336 can be a periodic transmit (TX) signal applied to one or more transmit electrodes in a mutual capacitance type sense network. A TX signal can induce a response on corresponding RX signals, which can be sensed to determine whether a touch event has occurred.

A controller 330 can control capacitance sensing operations in a system 300. In the embodiment shown, a controller can include sense control circuits 338, filter circuits 311, position determination circuits 320, and noise listening circuits 302. In some embodiments, controller 330 circuits (e.g., 338, 311, 320 and 302) can be implemented by a processor executing instructions. However, in other embodiments, all or a portion of such circuits can be implemented by custom logic and/or programmable logic.

Sense control circuits 338 can generate signals for controlling acquisition of signals from sense network 308. In the embodiment shown, sense control circuits 338 can activate switch control signals SW_CTRL applied to switching circuits 332. In a particular embodiment, mutual capacitance sensing can be employed, and sense control circuits 338 can sequentially connect a TX signal from signal generator 336 to TX electrodes within sense network 308. As each TX electrode is driven with the TX signal, sense control circuits 338 can sequentially connect RX electrodes to ADC 334 to generate digital sense values for each RX electrode. It is understood that other embodiments can use different sensing operations.

Noise listening circuits 302 can also control acquisition of signals from sense network 308 by activating switch control signals SW_CTRL. However, noise listening circuit 302 can configure paths to sense network 308 to enable the detection of local noise, as opposed to touch events. In a particular embodiment, noise listening circuit 302 can isolate signal generator 336 from sense network 308. In addition, multiple groups of electrodes (e.g., RX, TX or both) can be simultaneously connected to ADC 334. Noise listener 302 can filter such digital values and then compare them to noise thresholds to determine a noise level. Such actions can include arriving at "No Noise", "Noise" and optionally "High Noise" determinations as described for FIG. 2.

In response to a noise determination from noise listening circuit 302, a controller 330 can alter capacitance sensing operations. In one embodiment, if noise is detected, signal acquisition times can be increased (e.g., subconversions increased) and filtering can be changed (e.g., median filtering instead of common mode filtering).

Filter circuits 311 can filter sense values generated during sense operations and noise detection operations. In the embodiment shown, filter circuits 311 can enable one or more types of median filtering 316 and one or more types of CMF 312. It is understood that filter circuits can be digital circuits operating on digital values representing sensed capacitance. In a particular embodiment, filter circuits 311 can include a processor creating sense value data arrays from values output from ADC 334. These arrays of sense values can be manipulated according to one or more selected filtering algorithm to create an output array of filtered sense values. A type of filtering employed by filter circuits 311 can be selected based on detected noise levels.

Position determination circuits 320 can take filtered sense values to generate touch position values (or no detected touches) for use by other processes, such as applications run by a device.

In this way, a capacitance sensing system can include listening circuits for detecting noise values and digital filters, selectable based on a detected noise level.

Figure 4:
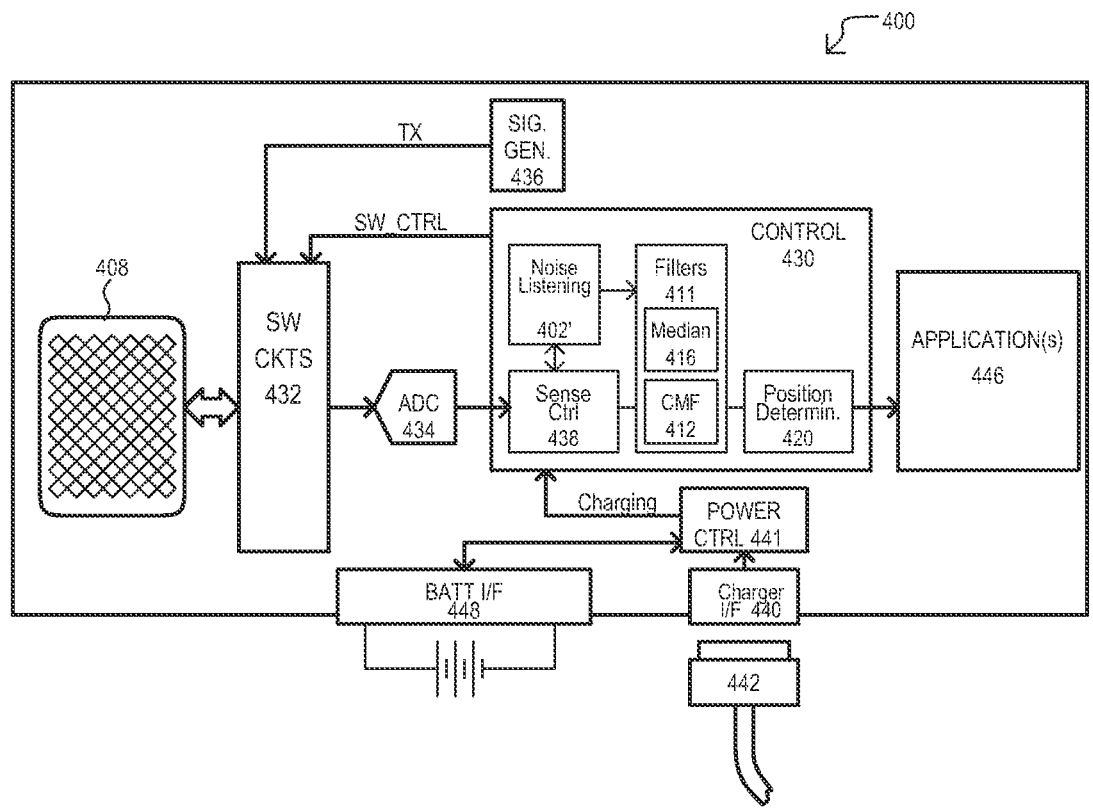
FIG. 4 is a block schematic diagram of a capacitance sensing system having charger detection according to an embodiment.

Referring now to FIG. 4, a capacitance sensing system according to another embodiment is shown in a block schematic diagram and designated by the general reference character 400. In the embodiment of FIG. 4, a noise listening operation can vary based on a system condition. In the particular embodiment shown, noise listening can be enabled or disabled based on the presence of a charger.

A system 400 can include sections like those of FIG. 3, and such sections can have the same or equivalent structures as FIG. 3. FIG. 4 differs from FIG. 3 in that it also shows a charger interface 440, battery interface 448, power control circuits 441, and application(s) 446.

A charger interface 440 can enable power to be provided to system 400 that charges a battery via a battery interface 448. In some embodiments, a charger interface 440 can be a physical interface that creates a mechanical connection between a charger 442 and the system 400. In a particular embodiment, such a physical connection can include a ground connection that can give rise to injected current as represented in FIG. 22. However, alternate embodiments can include wireless charging interfaces.

Power control circuits 441 can activate a charging indication (Charging) when a charger 442 is coupled to a system 400, and thus can present an external noise source. In addition, power control circuits 441 can control charging operations of a battery via batter interface 448.

Referring still to FIG. 4, listening circuits 402' can vary listening operations in response to a charger indication (Charging). In one embodiment, if the Charging indication is inactive, indicating that a charger 442 is not present, listening circuits 402' can be disabled. If the Charging indication is active, listening circuits 402' can be enabled. However in other embodiments, listening circuits 402' can switch between different types of listening operations based on a charger indication (Charging).

It is understood that while a charger can be one source of noise, other types of power supplies for a device can be a source of noise (e.g., AC/DC converters within such devices). For example, some devices can be connected to a computer with its own external power supply, or even a charger within an automobile.

Application(s) 446 can be programs executable by a system 400 utilizing position values from position determination circuits 420.

In this way, a capacitance sensing system can vary listening circuit operations that detect noise values based on a physical condition of the system.

Figure 5:
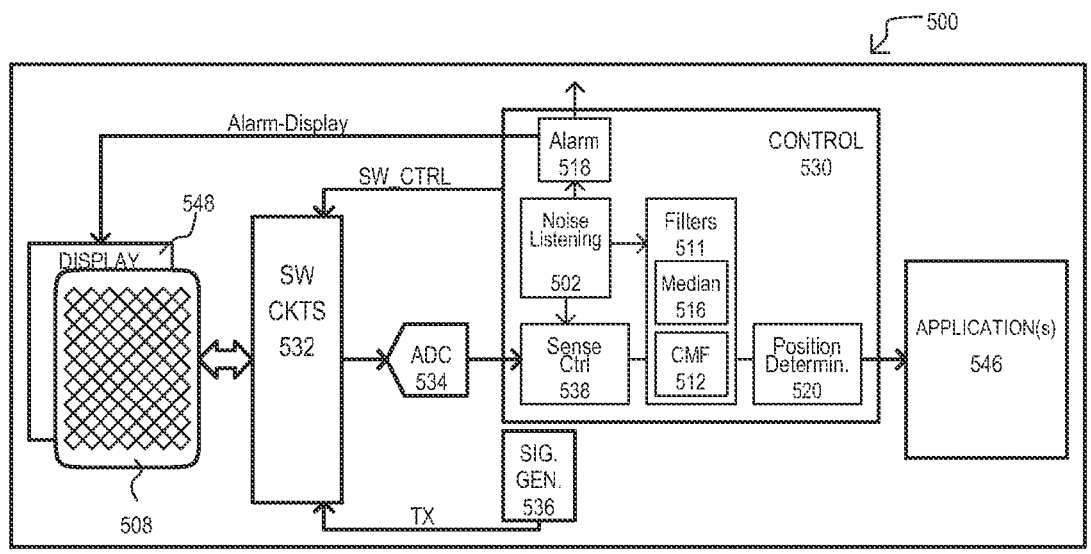
FIG. 5 is a block schematic diagram of a capacitance sensing system having a display alarm according to an embodiment.

Referring now to FIG. 5, a capacitance sensing system according to a further embodiment is shown in a block schematic diagram and designated by the general reference character 500. In the embodiment of FIG. 5, an alarm can be generated when noise exceeds a threshold value.

A system 500 can include sections like those of FIG. 3, and such sections can have the same or equivalent structures as FIG. 3. FIG. 5 differs from FIG. 3 in that is also shows an alarm circuit 518, a display 548 and application(s) 546.

A listening circuit 502 can provide a noise level indication to alarm circuit 516 when detected noise is determined to exceed a high threshold. An alarm circuit 516 can activate one or more alarms, when the high noise threshold is exceeded. In the very particular embodiment shown, alarm circuit 516 can provide an alarm (Alarm-Display) to display 548. In response to such an alarm, a display 548 can show a visual alarm indicating that touch inputs are affected by noise (e.g., touch inputs will not be accepted, etc.). In one particular embodiment, display 548 and sense network 508 can be a touchscreen assembly (i.e., sense network 508 is physically overlaid on display 548).

In some embodiments, an alarm circuit 516 can provide an alarm to application(s) 546. Such applications can then alter execution and/or generate their own alarm. Further, as noted in conjunction with FIG. 2, an alarm can take various other forms (e.g., an interrupt, or the like).

In this way, a capacitance sensing system can generate an alarm for a user in the event noise levels exceed a predetermined threshold.

Figure 6:
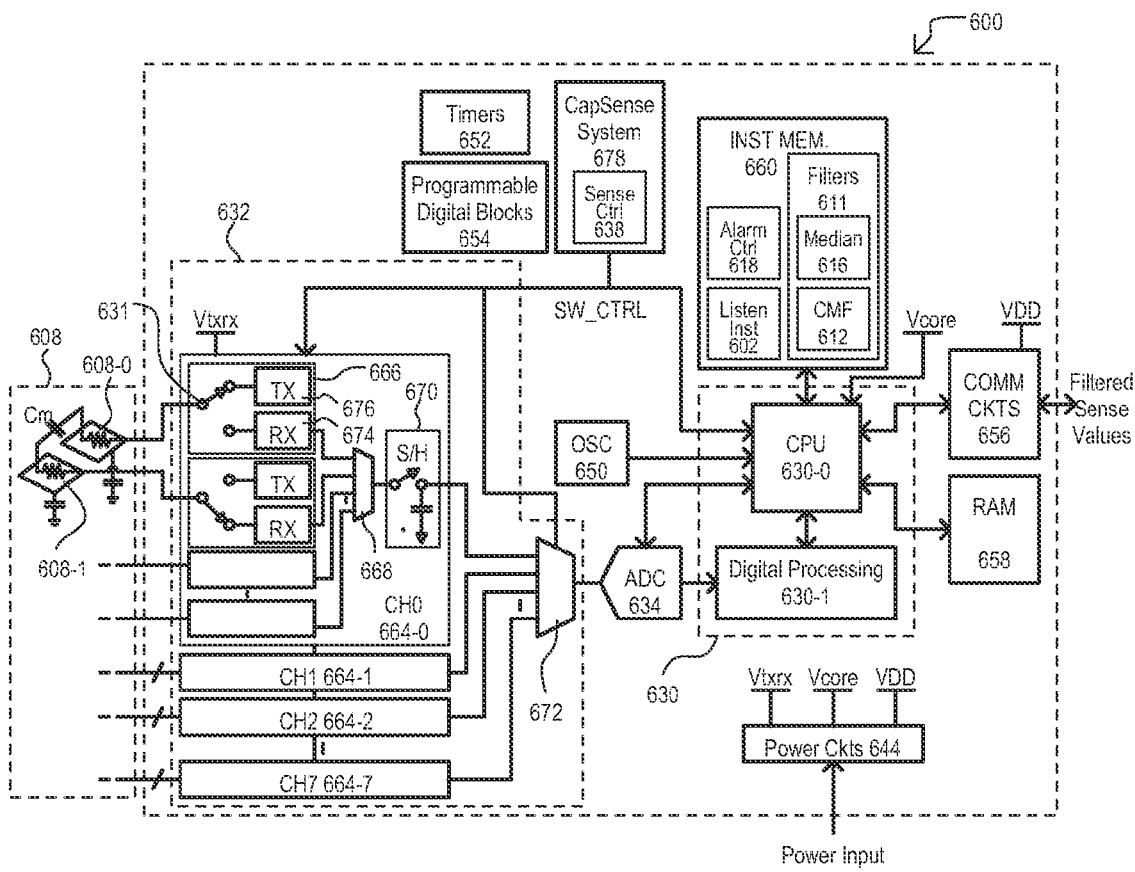
FIG. 6 is a block schematic diagram of a capacitance sensing system according to another embodiment.

Referring now to FIG. 6, a capacitance sensing system according to another embodiment is shown in a block schematic diagram and designated by the general reference character 600. The embodiment of FIG. 6 shows an implementation utilizing a processor and instructions to provide listening, selectable filtering, and alarm functions.

A system 600 can include switching circuits 632, controller 630, a capacitance sense system 678, oscillator circuits 650, an ADC 634, instruction memory 660, communication circuits 656, random access memory (RAM) 658, and a power control circuits 644.

Switching circuits 632 can provide analog signal paths between a sense network 608 and circuits within a system 600. In the embodiment shown, switching circuits 632 can include a number of channels 664-0 to -7 and a channel multiplexer (MUX) 672. Switching and MUXing operations within switching circuits 632 can be controlled by switch control signals (SW_CTRL) provided by controller 630. Each channel (664-0 to -7) can include a number of input/output (I/O) switches (one shown 666) connected to an I/O connection 631, an I/O MUX 668, and a sample and hold (S/H) circuit 670. Each I/O switch (666) can connect a corresponding I/O 631 to a RX path (one shown as 674) or a TX path (one shown as 676). I/O MUX 668 can connect one of RX paths 674 within a channel to the corresponding S/H circuit 670. TX paths 676 can receive a TX signal. A channel MUX 672 can selectively connect a S/H circuit 670 within each channel (664-0 to -7) to ADC 634.

An ADC 634 can include any suitable ADC as described herein, or an equivalent.

FIG. 6 shows a system 600 connected to mutual capacitance sense network 608. Sense network 608 can include TX electrodes formed by TX plates (one shown as 608-0) and RX plates (one shown as 608-1). By operation of switching circuits 632, TX electrodes can be connected to a TX path 676, while multiple RX electrodes are connected to corresponding RX paths 674.

In the embodiment of FIG. 6, a controller 630 can include a processor 630-0 and digital processing circuits 630-1. A processor 630-0 can control operations of digital processing circuits 630-1 in response to instructions stored in instruction memory 660. Instruction memory 660 can include noise listening instructions 602, alarm control instructions 618, and filter instructions 611. Filter instructions 611 can include multiple filtering operations, and in the embodiment shown, can include median filter instructions 616 and CMF instructions 612.

In response to noise listening instructions 602, a controller 630 can generate signals that connect multiple I/Os 631 to ADC 634. In one embodiment, values can be subject to an initial listening CMF operation. Such an operation can be called from filter instructions 611 or be built into noise listening instructions 602. Resulting values can then be compared to one or more thresholds to determine a noise level. If a noise level exceeds a certain level, a listening circuit 602 can establish capacitance sensing parameters directed to filtering local noise (e.g., an external noise source). In some embodiments, such parameters can include those described for other embodiments, including an increased scan time and/or non-common mode (e.g., median) filtering. In addition, if a noise threshold level is above another certain level, alarm instructions 618 can be called to generate an appropriate alarm.

Processor 630-0 alone, or in combination with digital processing circuits 630-1, can perform arithmetic and logic operations for detecting noise and/or filtering sense values.

Capacitance sensing system 678 can include circuits for performing capacitance sensing operations. In some embodiments, capacitance sensing system 678 can include sense control circuits 638 that generate switch control signals for controlling switching circuits 632. In one embodiment, capacitance sensing system 678 can perform sensing operation based on criteria established by controller 630. In a particular embodiment, a controller 630 can vary a sensing time (e.g., number of subconversions) based on a noise level.

Referring still to FIG. 6, oscillator circuits 650 can generate signals for controlling timing of operations within system 600. In one embodiment a TX signal presented at TX paths 676 can be provided by, or derived from signals generated by oscillator circuits 650.

Communication circuits 656 can provide capacitance sensing results to other systems or circuits of a device containing the capacitance sensing system 600. RAM 658 can be provided to enable processor 630-0 to execute arithmetic operations and/or temporarily store instruction data. In particular embodiments, a RAM 658 can store sense value matrices that are manipulated by processor 630-0 to detect noise and/or filter capacitance sense values.

Power control circuits 644 can generate power supply voltages for various portions within a system 600. In some embodiments, power control circuits 644 provide a charging indication, like that described for FIG. 4, which can indicate when a charger is coupled to the system 600. A processor 630-0 can then bypass noise listening instructions 602 in the absence of a charger, or may select between multiple listening algorithms based on the presence or absence of a charger.

FIG. 6 also shows timer circuits 652 and programmable circuits 654. Timer circuits 652 can provide timing functions for use by various sections of system 600. Programmable circuits 654 can be programmed with configuration data to perform custom function. In the embodiment shown, programmable circuits 654 can include programmable digital blocks.

In a very particular embodiment, a system 600 can be implemented with a PSoC®3 type programmable system-on-chip fabricated by Cypress Semiconductor Corporation of San Jose, Calif. U.S.A.

In this way, a capacitance sensing system can include a processor that can execute any of: noise listening instructions, noise alarm instructions, median filtering, and CMF.

Figure 7:
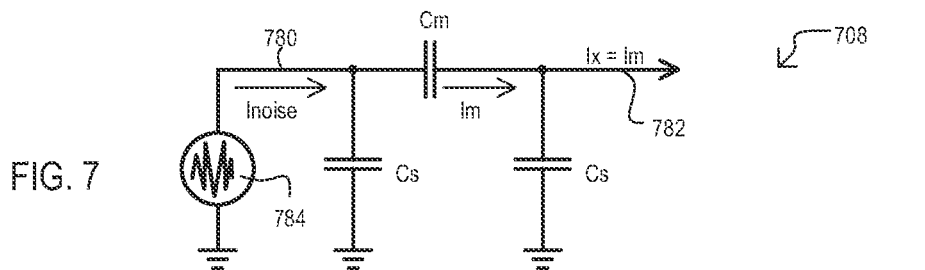
FIG. 7 is a schematic diagram of a noise listening circuit according to an embodiment.

FIG. 7 is a schematic diagram showing a noise listening configuration for a mutual capacitance sense network 708 according to an embodiment. A sense network 708 can include first electrodes (one shown as 780) and second electrodes (one shown as 782) coupled to one another by a mutual capacitance Cm. Noise, represented by noise voltage source 784, on one or more first electrodes 780 can induce a noise signal (Ix) by mutual capacitance coupling. In a very particular embodiment, first electrodes 780 can be TX electrodes and second electrodes 782 can be RX electrodes. However, the TX electrodes are not driven by any system generated TX signal, but rather are used to detect noise.

Figure 8A:
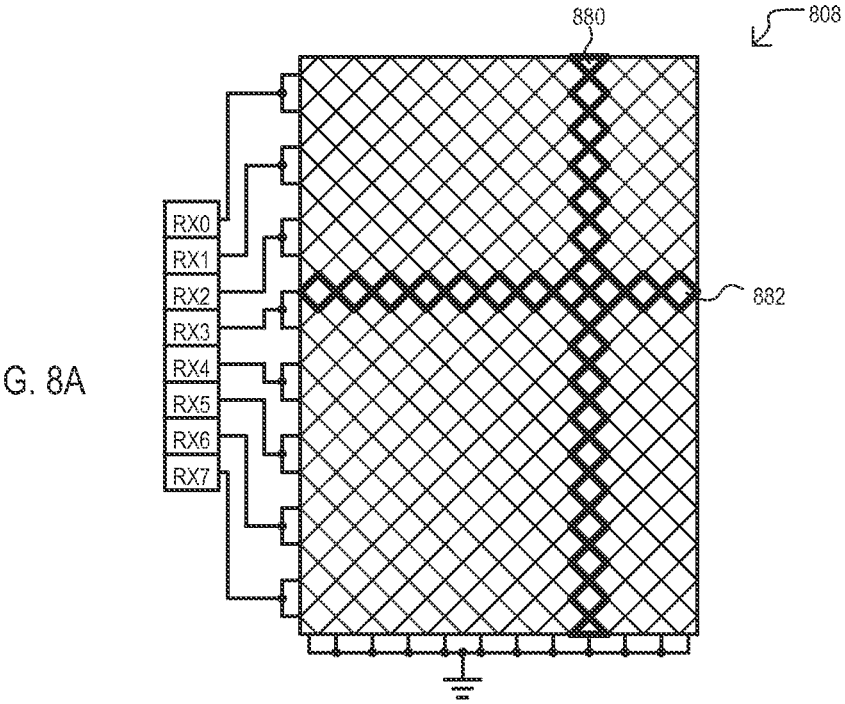
FIGS. 8A and 8B are plan views of a noise listening configurations for a mutual capacitance sense network according to embodiments.
Figure 8B:
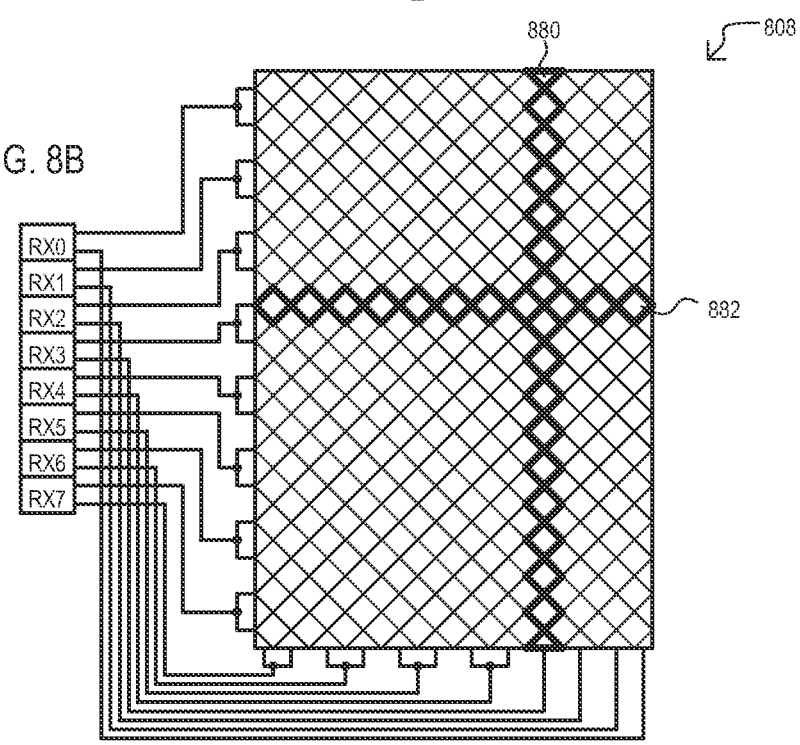

FIGS. 8A and 8B show different noise listening configurations according to embodiments.

FIG. 8A shows a noise listening configuration for a mutual capacitance sense network 808 according to one embodiment. Sense network 808 can include TX electrodes (one highlighted as 880) arranged in one direction and RX electrodes (one highlighted as 882) arranged in another direction. In the embodiment shown, sets of RX electrodes 882 (in this embodiment, sets of two) can be connected to RX paths (RX0 to RX7) for noise listening operations. TX electrodes 880 can be connected to ground.

FIG. 8B shows a noise listening configuration for a mutual capacitance sense network 808 according to another embodiment. Sense network 808 can have the structure shown in FIG. 8A. However, RX electrodes 882 and TX electrodes 880 can be commonly connected to a same RX path. In the particular embodiment shown, RX paths RX0 to RX3 can be connected to two RX electrodes 882 and one TX electrode 880, while RX paths RX4 to RX7 can be connected to two RX electrodes 882 and two TX electrodes 880.

In this way, RX and/or TX electrodes of a mutual capacitance sense network can be connected to capacitance sensing inputs to listen for noise while a TX signal is prevented from being applied to the network.

FIGS. 9A and 9B show listening operations according to embodiments.

FIG. 9A shows a listening operation 900-A having serial noise listening operations. Progression of time is shown by arrow "t". A listening operation 900-A can begin with a listening scanning action 902. Such an action can include acquiring capacitance values across multiple sensors (e.g., electrodes). In particular embodiments, such a step can include establishing connections to a mutual capacitance sense array like that shown in FIG. 8A or 8B. Following a listening scanning 902, acquired values can be subject to listening CMF 904. A listening CMF can include common mode filtering that can filter out noise common to all electrodes and thus help isolate local noise (e.g., external type noise). Filtered sense values can then be subject to a noise detection action 906. Such an action can compare sensed capacitance levels to one or more limits to determine a noise level. Following a noise detection action 906, a listening operation 900-A can repeat, performing another listening scanning action 902.

FIG. 9B shows a listening operation 900-B having pipelined noise listening operations. Progression of time is shown by arrow "t". A listening operation 900-B can begin with a listening scanning action 902-1, which can acquire a first set of raw capacitance values. Following listening scanning operation 902-1, a next listening scanning operation 902-2 can begin. However, while such second scanning action (902-2) is undertaken, the first set of raw data acquired with the first scanning action 902-1 can be common mode filtered 904-1 and subject to noise detection 906-1.

In this way, while raw data is gathered for noise listening on electrodes, previously gathered raw data can be common mode filtered and checked for noise events.

In some mutual capacitance embodiments, that drive TX electrodes with a transmit (i.e., excitation) signal while RX electrodes provide sense signals via a mutual capacitance, in a listening scanning action (e.g., 902 and/or 902-1), capacitance can be sensed on RX electrodes, but without the TX electrodes being driven with a transmit signal.

FIG. 10 shows a noise listening operation 1000 according to one embodiment in a flow diagram. An operation 1000 can include a scanning initialization 1010. A scanning initialization can configure connections to a sense network to enable the sensing of noise across multiple channels. Such an initialization can include changing sense network configurations from a standard touch sensing configuration to a noise listening configuration.

Once scanning initialization 1010 is complete, an operation 1000 can, in parallel, perform noise scanning 1012 and noise detection 1014. Noise scanning 1012 can include acquiring sense values from electrodes. Noise detection 1014 can include detecting noise from previously acquired sense values. Once noise scanning is complete (Yes from 1016), a noise listening operation 1000 can restore a sense network to a normal state 1018. A normal state can be that utilized for standard sensing operations (e.g., touch sensing).

FIG. 11 shows a scanning initialization operation 1100 according to an embodiment. A scanning initialization operation 1100 can be one particular implementation of that shown as 1010 in FIG. 10. Scanning initialization operation 1100 can be a scanning initialization operation for a mutual capacitance sense network. An operation 1100 can include disabling any circuits utilized in standard scanning operations that could interfere with noise detection (1120). In the embodiment shown, an action 1120 can include turning off current digital-to-analog converters (iDACs) connected to a sense network. RX paths can be configured as high impedance inputs (1122). RX paths can then be connected to input channels (1124). A signal acquisition time (e.g., scan time) can then be set that is suitable for the noise to be detected. In the embodiment of FIG. 11, such an action can include setting a number of subconversions (1126) to a predetermined value. All active channels can then be turned on (1128). Such an action can enable electrodes to be connected to capacitance sensing circuits. A scan can then start (1130). Such an action can acquire raw sense values to enable noise to be detected. A scanning initialization operation 1100 can then end.

FIG. 12 shows a restore-to-normal operation 1232 according to an embodiment. A restore-to-normal operation 1232 can be one particular implementation of that shown as 1018 in FIG. 10. Restore-to-normal operation 1232 can include disconnecting all RX paths from input channels (1234). Such RX channels can then be configured for standard sensing operations (1236). A signal acquisition time (e.g., scan time) can then be returned to that utilized for standard sensing operations (1238). In the embodiment of FIG. 12, such an action can include setting a number of subconversions. An operation 1232 can include enabling previously disabled circuits utilized in standard scanning operations (1240). In the embodiment shown, an action 1240 can include turning on iDACs. A restore to normal operation 1232 can then end.

Figure 13:
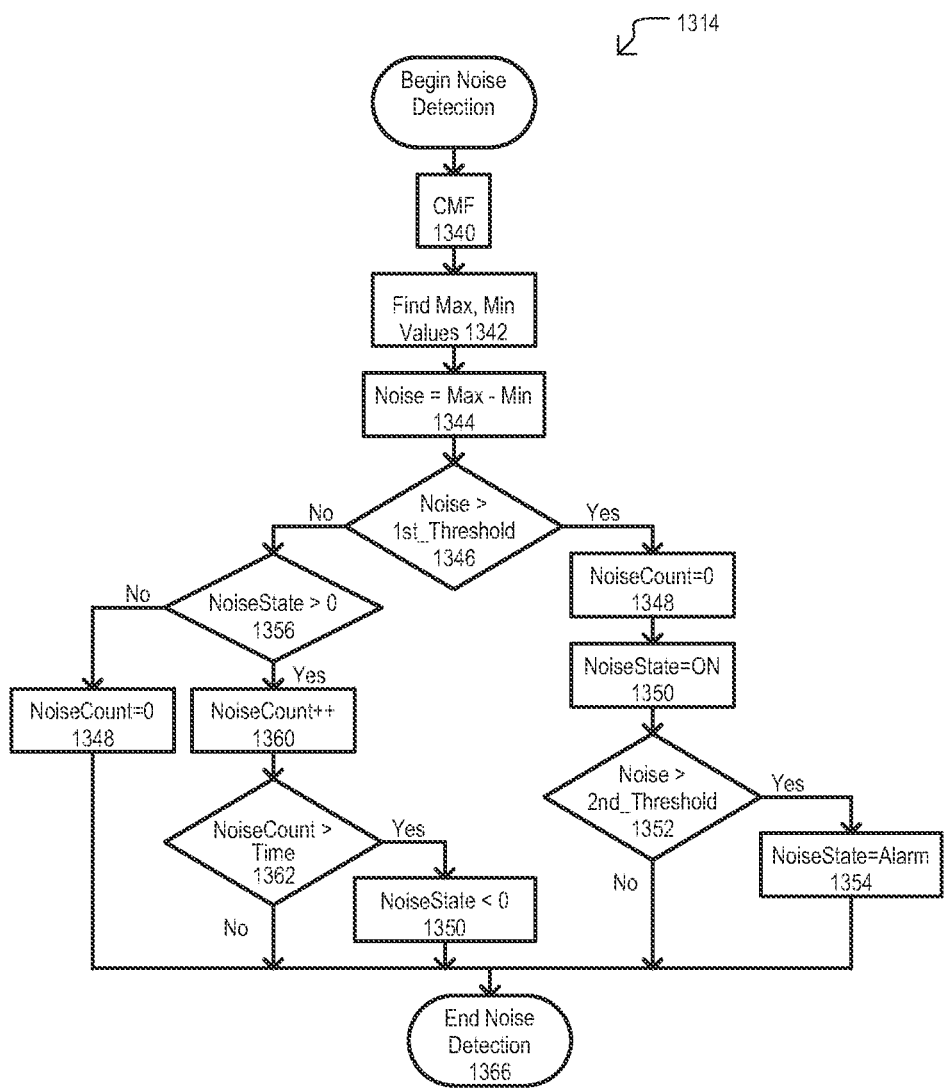
FIG. 13 is a flow diagram of a noise detection operation according to an embodiment.

FIG. 13 shows a noise detection operation 1314 according to an embodiment. A noise detection operation 1314 can be one particular implementation of that shown as 1014 in FIG. 10. A noise detection operation 1314 can include a CMF operation 1340. Such filtering can remove noise common to electrodes and thus can improve a signal from any local noise (i.e., external noise). Operation 1314 can then determine a noise value. In the particular embodiment shown determining a noise value can include finding maximum and minimum values from the CMF filtered values (1342), and then determining the difference between such values (1344).

A noise value can then be compared to a first threshold (1346). If a noise value is above a first threshold (Yes from 1346), a listening timeout value can be reset (1348) and a noise level can be set to a first value (ON) (1350). If noise has been determined to above a first threshold, the noise can also be compared to a second threshold (1352). If a noise value is above a second threshold (Yes from 1352), a noise level can be set to a second value (Alarm) (1354). An operation can then end 1366. If a noise value is below a second threshold (No from 1352), an operation can also end 1366.

If a noise value is not above a first threshold (No from 1346), a noise detection operation 1314 can determine if a noise level should be returned to a zero value (i.e., no noise). In the embodiment shown, if a noise level can be checked to see if it still indicates a high noise state (i.e., ON or Alarm) (1356). If no elevated noise is indicated (No from 1356) a timeout value can be reset (1348). If elevated noise is indicated (Yes from 1356) a timeout value can be incremented (1348). The timeout value can then be compared to a limit (1362). If a timeout value exceeds a limit (Yes from 1362), the noise level can be returned to the no noise state (1350). If a timeout value does not exceed a limit (No from 1362), an operation can end 1366.

Figure 14:
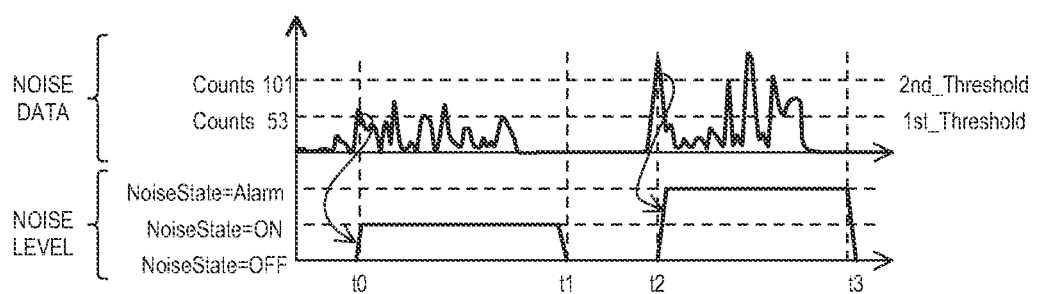
FIG. 14 is a timing diagram showing a noise detection operation that can provide an alarm condition according to an embodiment.

FIG. 14 is a timing diagram showing a noise detection operation according to one embodiment. FIG. 14 includes a waveform NOISE DATA, showing noise sense values acquired by a noise listening operation. Projected onto the NOISE DATA waveform are two noise threshold levels ($1^{st}$_Threshold and $2^{nd}$_Threshold).

FIG. 14 also includes a waveform NOISE LEVEL that shows noise levels determined by a noise detection operation. NOISE LEVEL can indicate three different noise levels. NoiseState=OFF can show noise values below a first threshold ($1^{st}$_Threshold). NoiseState=ON can show noise values above the first threshold ($1^{st}$_Threshold). NoiseState=Alarm can show noise values above a second threshold (2nd_Threshold).

Referring still to FIG. 14, at about time t0, noise values can exceed a first threshold. As a result, a noise detection operation can set a noise level to ON. Eventually, noise levels time out, and at time t1, noise levels can return to an OFF state.

At about time t2, noise values can exceed a second threshold. As a result, a noise detection operation can set a noise level to Alarm. Eventually, noise levels time out, and at time t3, noise levels can return to an OFF state.

Figure 15:
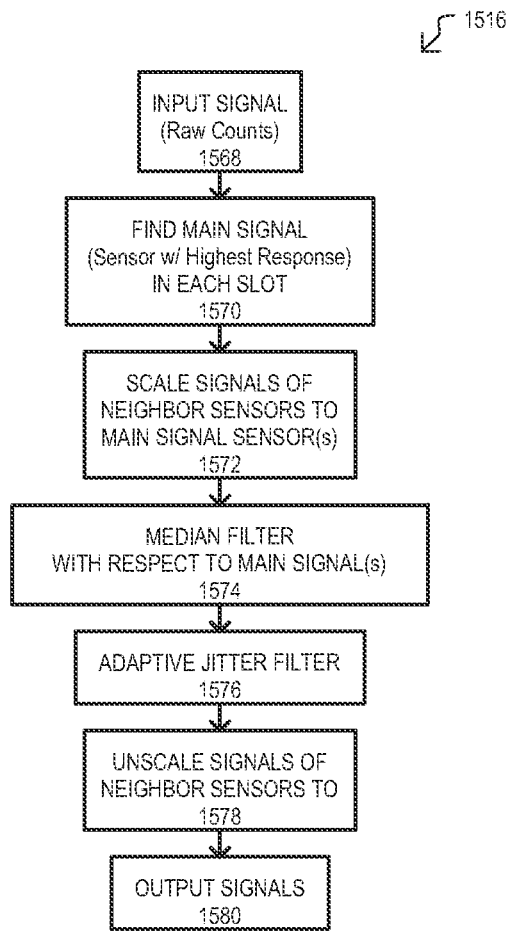
FIG. 15 is a flow diagram of a local noise filtering operation according to an embodiment.

Referring now to FIG. 15, a local noise filtering operation 1516 according to an embodiment is shown in a flow diagram. A local noise filtering operation 1516 can be performed on sense data in the event local (i.e., not common mode) noise levels are determined to exceed a certain level. An operation 1516 can include inputting sense signals (1568). Such an action can include inputting raw count values generated from an ADC connected to sense electrodes.

An operation 1516 can find a main signal (1570). Such an action can locate a potential touch location. As will be recalled, local noise can present around touch locations. In one embodiment, a main signal can correspond to a sensor having a highest response (which would, in the absence of noise, indicate a touch). An operation 1516 can then scale signals from neighboring sensors to the corresponding main sensor signal (1572). Neighbor sensors can be sensors physically proximate to the main sensor. In one embodiment, neighbor sensors can be sensor on opposing sides of a main sensor. A scaling operation can alter a sense value of a neighbor electrode based on how such an electrode varies from the main when a valid touch event occurs.

In one very particular embodiment, scaling can be based on a mean value when a touch is present for an electrode. Sense values for neighboring electrodes can be scaled according to scaling factors as follows:

$$k_A = (B_{Tmean}/A_{Tmean}), k_C = (B_{Tmean}/C_{Tmean})$$

where $k_A$ is a scaling factor for a count value from an electrode A which is a neighbor of an electrode B, $k_C$ is a scaling factor for a count value from an electrode C which is a neighbor of an electrode B opposite electrode A, and $A_{Tmean}$, $B_{Tmean}$, and $C_{Tmean}$ are mean sense values derived from touches to such electrodes.

Following a scaling of neighbor sensors, a median filter can be applied with respect to the main signal (1574). Such an action can include applying a median filter to sense values for electrodes. In one embodiment, a median filter can be applied to sensor signals from three consecutive time periods. A true touch event can provide an increase count value that may be sustained over multiple time periods. In contrast, local noise levels may vary in polarity over time. A median filter operation (e.g., 1574) can be a first type of non-linear filtering that is performed.

An operation 1516 can also include an adaptive jitter filter (AJF) operation (1576). An AJF operation (e.g., 1576) can be another non-linear filter operation. One particular example of an AJF operation is described below in more detail.

Following an AJF operation (1576), a previous scaling operation (e.g., 1572) can be reversed. That is filtered sense values corresponding to neighbor sensors proximate a main sensor can be "unscaled" (1578). A resulting set of sense values can then be output 1580.

Figures 16A, 16B:
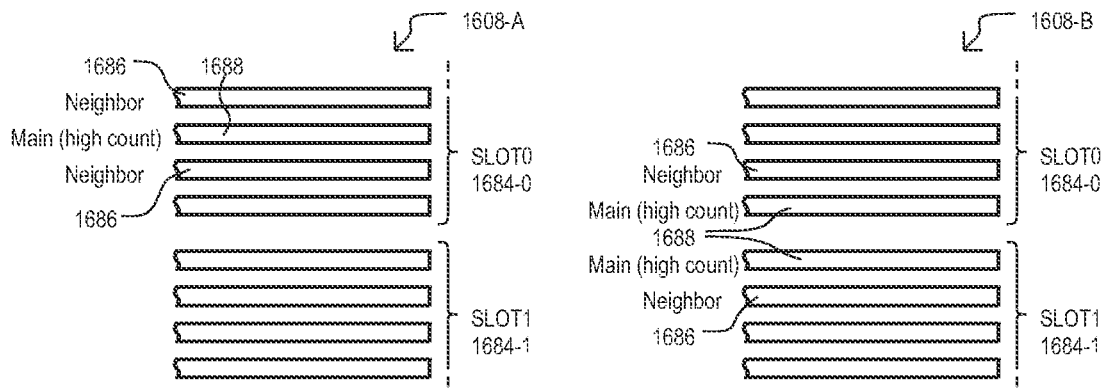
FIGS. 16A and 16B are plan views showing electrode selection for scaling in a filter operation according to an embodiment.

FIGS. 16A and 16B show a determination of a main signal from electrodes according to an embodiment. FIGS. 16A and 16B show electrodes physically arranged into two groups, shown as slots 1684-0/1. A sense operation can sense capacitance values for different slots with different sense operations. In one very particular embodiment, slots 1684-0/1 can be RX electrodes coupled to a same TX electrode(s) by a mutual capacitance.

FIG. 16A shows a sense operation that determines electrode 1688 has a highest response (count in this embodiment). Consequently, such an electrode can be considered a "main" electrode. Electrodes 1686 adjacent to main electrode 1688 can be considered neighbor electrodes. Sense values corresponding to neighbor electrodes 1686 can be scaled with respect to a sense value for main electrode.

FIG. 16B shows a sense operation in which main electrodes 1688 occur on ends of adjacent slots 1684-0/1. In such an arrangement, a neighbor electrode 1686 for each main electrode can be an electrode in a different slot.

Figure 17A:
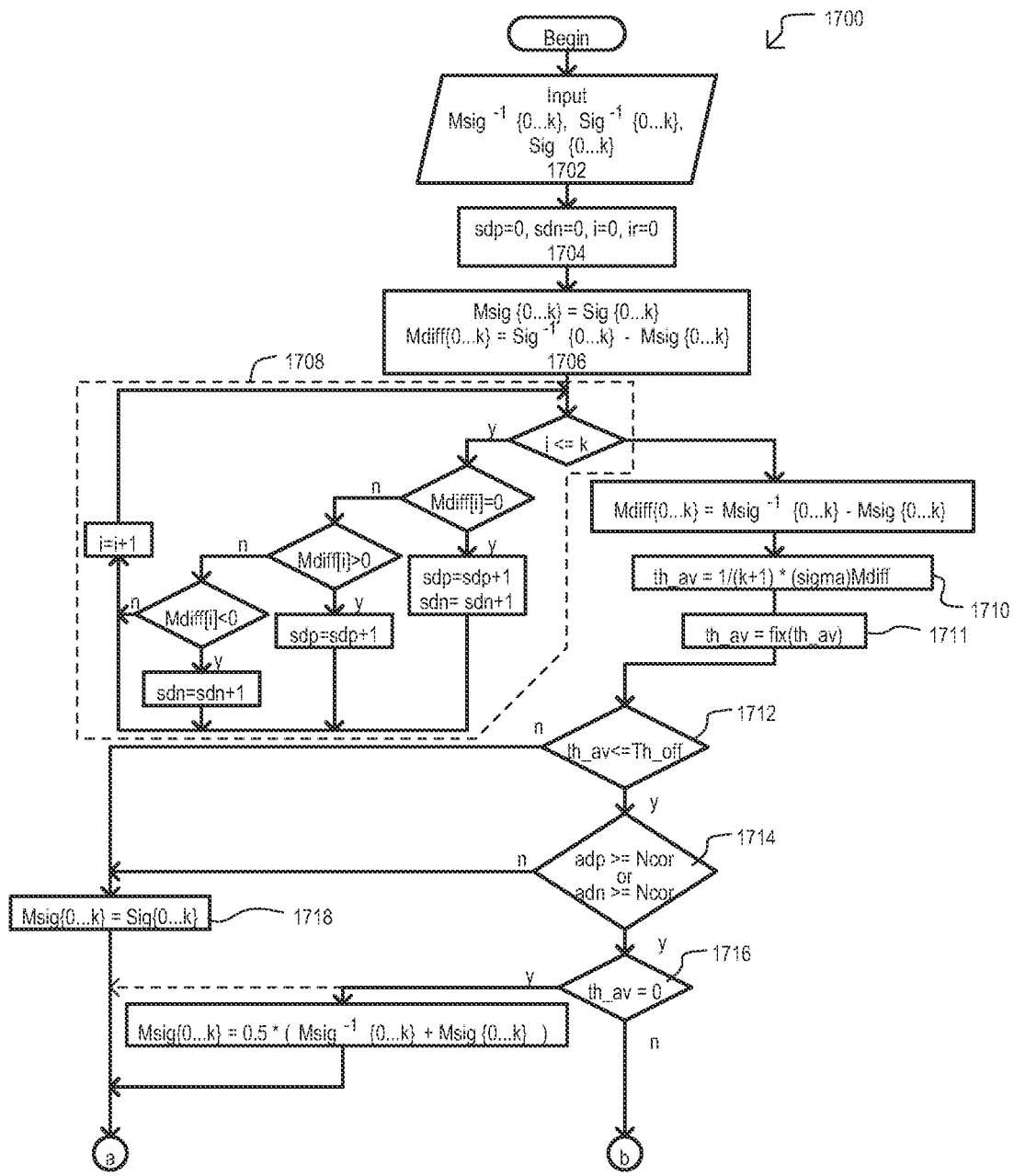
FIGS. 17A and 17B are flow diagrams of an adaptive jitter filter (AJF) according to an embodiment.
Figure 17B:
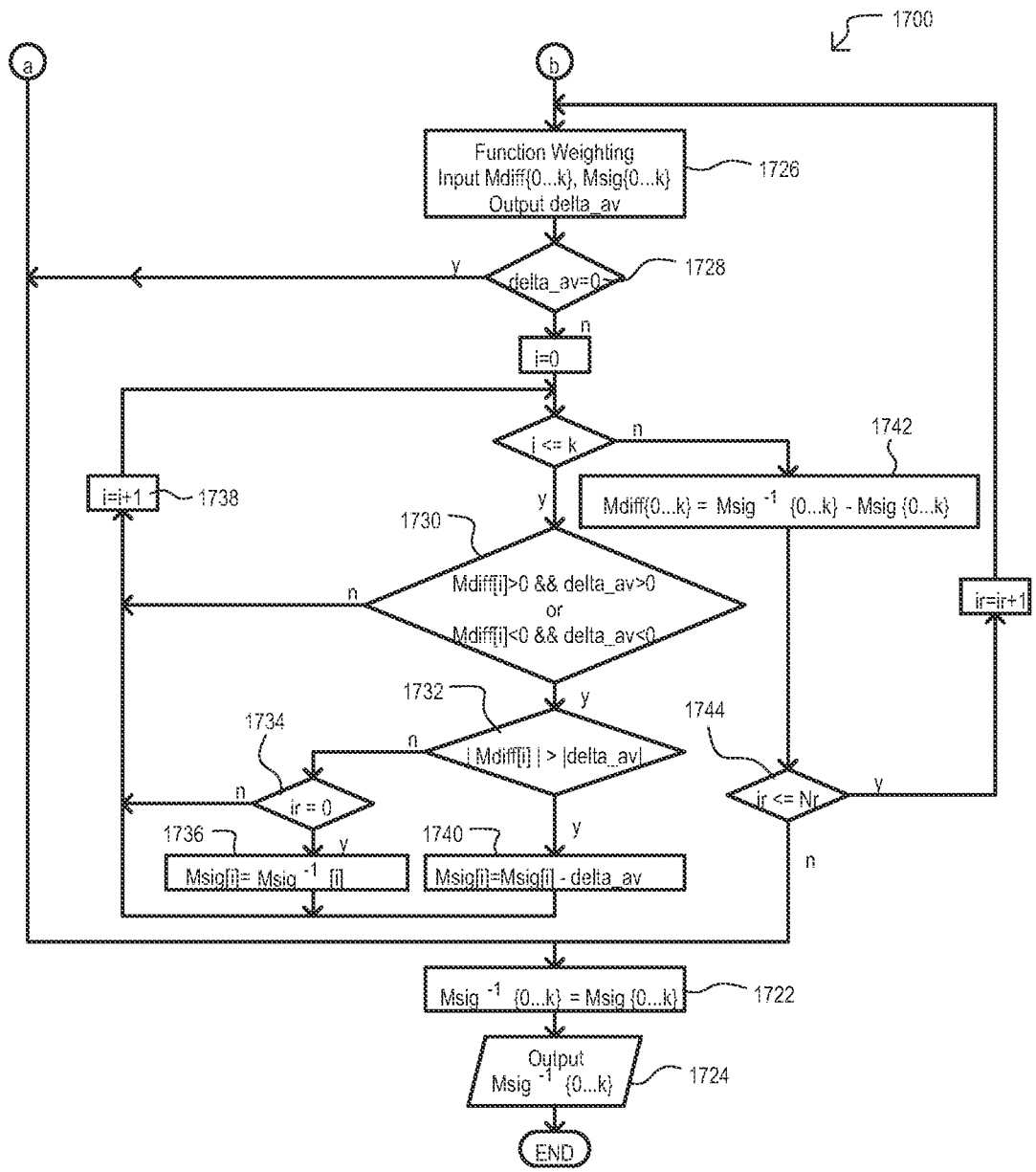

Referring now to FIGS. 17A and 17B, an AJF operation 1700 according to one embodiment is shown in flow diagram. An AJF can be one particular implementation of that shown as 1576 in FIG. 15. An AJF operation 1700 can perform filtering on a subset of electrodes based on average difference of such electrodes over time. FIGS. 17A and 17B are different portions of a flow diagram, with connections between the two shown as circled letters "a" and "b".

Referring first to FIG. 17A, an AJF operation 1700 can include inputting arrays of current signal values, and previously generated filtered signal values (1702). In the embodiment shown, this can include inputting values Msig$^{-1}${0...k} which can be previous filtered values generated by an AJF operation 1700 for an electrode set (e.g., a slot), values Sig$^{-1}${0...k} which can be previously input sense values for the same electrode set (which in some embodiments can include scaling and/or median filtering), and values Sig{0...k} which can be current input sense values for the same electrode set.

Various values can be initialized to zero, including a positive disparity value sdp, a negative disparity value sdn, and iteration count values i and it (1704). As will be understood from the discussion below, a positive disparity value sdp can represent the degree of correlation in a positive change from a previous sense value set and current a sense value set. A negative disparity value sdn can represent a same correlation, but in the other (i.e., opposite polarity) direction.

An operation 1700 can determine a difference between previous sense signals and current sense signals (1706). In the embodiment shown, an array Mdiff{0...k} can be created that holds such values (referred to herein as difference values).

An operation 1700 can then generate positive and negative disparity values utilizing such difference values (1708). In the embodiment shown, such an action can include determining if a difference between a previous sense value and its current level is positive, negative, or zero. A positive value will increase a positive disparity for the electrode set. Similarly, a negative value will decrease a negative disparity for the electrode set. In the embodiment shown, no difference in values (zero) can result in both positive and negative disparity values being increased.

Once disparity values have been generated, an operation can then calculate an average sum of the differences between sense signal sets (i.e., current and previous set) (1710). A function "fix" can remove a fractional part of a number (1711). Such an average value is shown as th_av in the embodiment of FIG. 17. If an average difference (th_av) is above a threshold value (n from 1712), filtering can stop, and current set of input values Sig{0...k} can be saved as filter values for a next filter operation and can be output as filtered values (1718, 1722, 1724). Such a threshold check can account from a multi-touch event occurring on the set of electrodes.

If an average difference (th_av) is below a threshold value (y from 1712), disparity values can be compared against correlation limits (1714). If either (i.e., positive or negative) disparity value is sufficiently small (n from 1714) filtering can once again end, with the current set of input values Sig{0...k} can be saved as filter values for a next filter operation and output as filtered values (1718, 1722, 1724).

If an average difference (th_av) is below a threshold value and correlation between sense signal sets is high (y from 1714) an average difference value th_av can be compared against a minimum value (in this case 0) (1716). If there is little difference between sense signal sets (y from 1716), a current signal sense value set and previous filtered sense value set can be averaged to create a current filtered sense value set (1720). This set can be saved as filter values for a next filter operation and output as filtered values (1718, 1722, 1724).

Referring now to FIG. 17B, when an average difference value (th_av) and disparity values are within predetermined ranges, an operation 1700 can call a weighting function 1726. A weighting function can increase sense values when a limited number of sense values in a set exceed a weighing threshold. A weighting function according to one particular embodiment will be described in more detail below. A weighting function can return a weighting value (delta_av) that can be used to weight sense values in a filtered set.

If a weighting function indicates no weighting (i.e., delta_av=0) (y from 1728), filtering can stop, and current set of input values Sig{0...k} can be saved as filter values for a next filter operation and output as filtered values (1718, 1722, 1724).

If a weighting function provides a weighting value (i.e., delta_av≠0) (n from 1728), an operation can selectively weight current sense values based on polarities of a difference value and the weighting value (delta_av). In particular, if a difference value for an electrode has the same polarity as the weighting value (n from 1730), the sense value may not be weighted.

However, if a difference value for an electrode has a different polarity than the weighting value (y from 1730), a magnitude of difference value can be compared to the weighting value (1732). If a magnitude of a difference is less than that of a weighting value (n from 1732), a multi-pass value can be checked to determine if the present operation is an initial pass (1734). If it is an initial weighting pass (n from 1734), an operation 1700 can continue to a next value of the set (1738). However, if it is a follow on weighting pass (y from 1734), a current value can be set to a previous filtered value, and an operation 1700 can continue to a next value of the set (1738). If the magnitude of a difference between sense values is greater than that of a weighting value (y from 1732), the weighting value can be subtracted from the current value (1740), and an operation 1700 can continue to a next value of the set (1738).

When all sense values of a set have been examined for weighting, a difference set can be created from the weighted values (1742). A multi-pass value can then be checked to determine if the present operation is a last pass (1744). If the operation is not a last pass (y from 1744), a weighting function can be called again with the updated values. If the operation is a last pass (n from 1744), a current set of filtered values can be saved as filter values for a next operation and output as filtered values (1718, 1722, 1724).

Figure 18A:
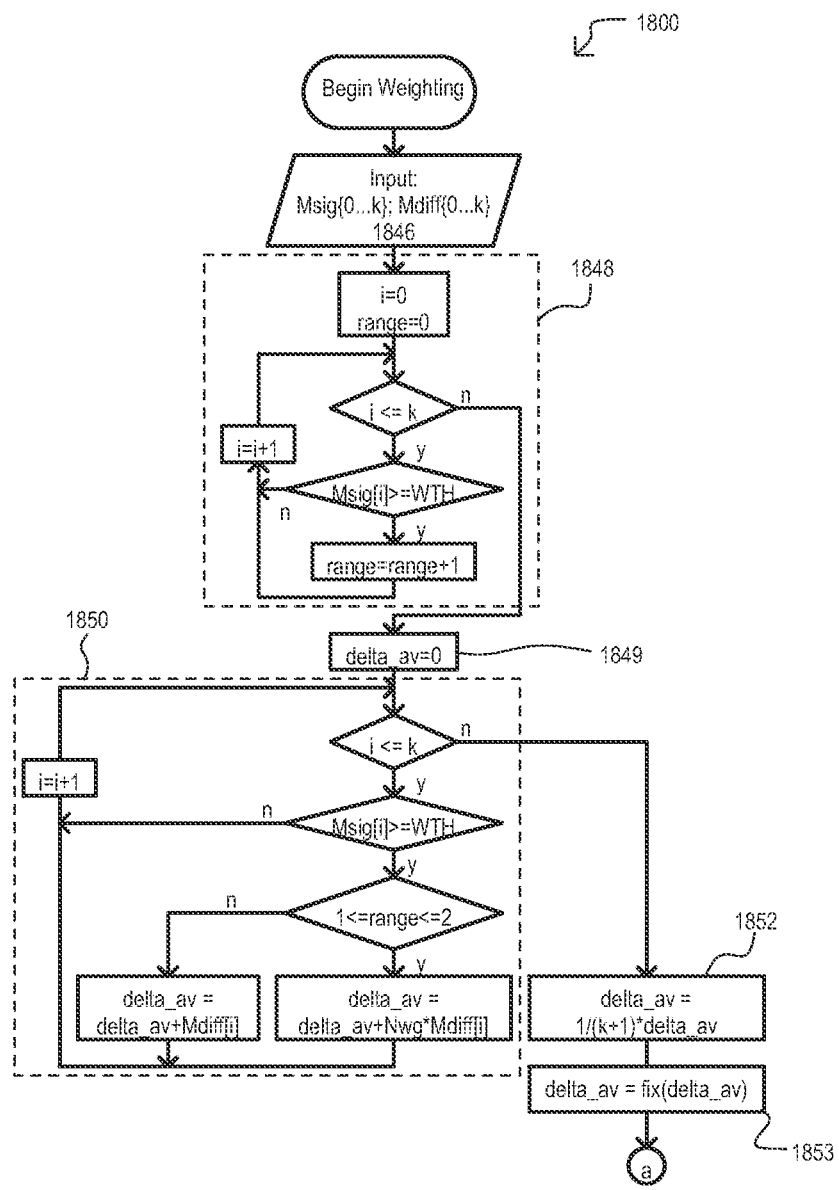
FIGS. 18A and 18B are flow diagrams of a weighting function that can be included in the AJF according to an embodiment.
Figure 18B:
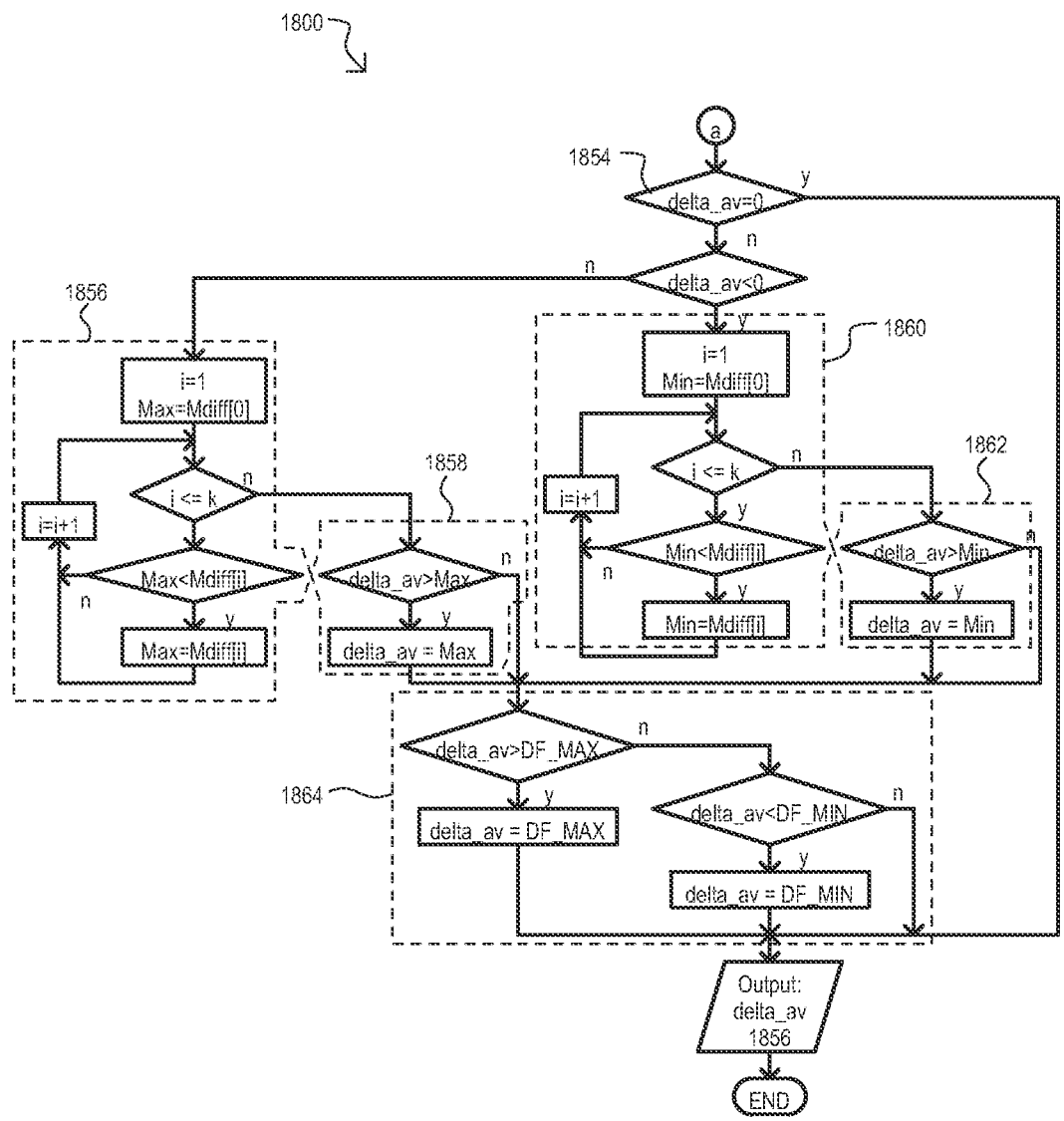

Referring now to FIGS. 18A and 18B, a weighting function 1800 according to one embodiment is shown in flow diagram. A weighting function 1800 can be one particular implementation of that shown as 1726 in FIG. 17. A weighting function 1800 can weight sense values in a set of electrodes when limited numbers of electrodes in the set exceed a weight threshold. FIGS. 18A and 18B are different portions of a flow diagram, with a connection between the two shown as circled letter "a".

Referring first to FIG. 18A, a weighting function 1800 can include inputting current filtered values Msig{0 ... k} and difference values Mdiff{0 ... k} (1846). A function 1800 can then examine a filtered value for each electrode in a set to see if it exceeds a weighting threshold (WTH). Each time a sense value exceeds a weighting threshold (WTH) a range value can be incremented (1848). Thus, a range value (range) can represent how many electrodes in a set exceed WTH.

Once a range value is established, a weighting value can be initialized (1849).

Each filtered value can be compared to a weighting threshold (1850). According to such a comparison, components of a resulting weighting value (delta_av) can be increased or decreased depending upon a range value. In the embodiment shown, if a range value outside of some minimum and maximum value (in the embodiment shown, less than or greater than two), a weighting component can be a difference value for the filtered value (delta_av=delta_av+Mdiff[i]). However, if a range value is within a predetermined range (in this embodiment, is "2"), a weighting component can be increased by multiplying by the difference value by a weighting factor (Nwg) (delta_av=delta_av+Nwg*Mdiff[i]).

Once all filtered values have been compared and components for the weighting value added up, an average of the values can be generated 1852. In the embodiment shown, fractional portions of weighting values can then be removed (1853).

Referring now to FIG. 18B, if a weighting value is zero (y from 1854) a weighting function can end, and a the weighting value (zero) can be provided as an output weighting value (1856) (for use in the AJF). If a weighting value is positive, a maximum difference value (Max) from the set of difference values can be determined (1856). If a weighting value (delta_av) is greater than a maximum value (Max), the weighting value can be set to the maximum value (1858). In a similar fashion, if a weighting value is negative, a minimum value (Min) from the set of difference values can be determined (1860). If a weighting value (delta_av) is greater than a minimum value (Min), the weighting value can be set to the minimum value (1862).

A weighting value (delta_av) can then be bounded by a high limit value DF_MAX and low limit value DF_MIN (1864). If a weighting value (delta_av) is greater than high limit, it can be set to the high limit. Similarly, if a weighting value (delta_av) is less than low limit, it can be set to the low limit.

The resulting weighting value can then be provided as an output weighting value (1856) (for use in the AJF).

It is understood that FIGS. 17A to 18B show an AJF and weighting function according to a very particular embodiment. Alternate embodiments can realize such operations, or equivalent operation, with other circuits and/or architectures.

Figure 19:
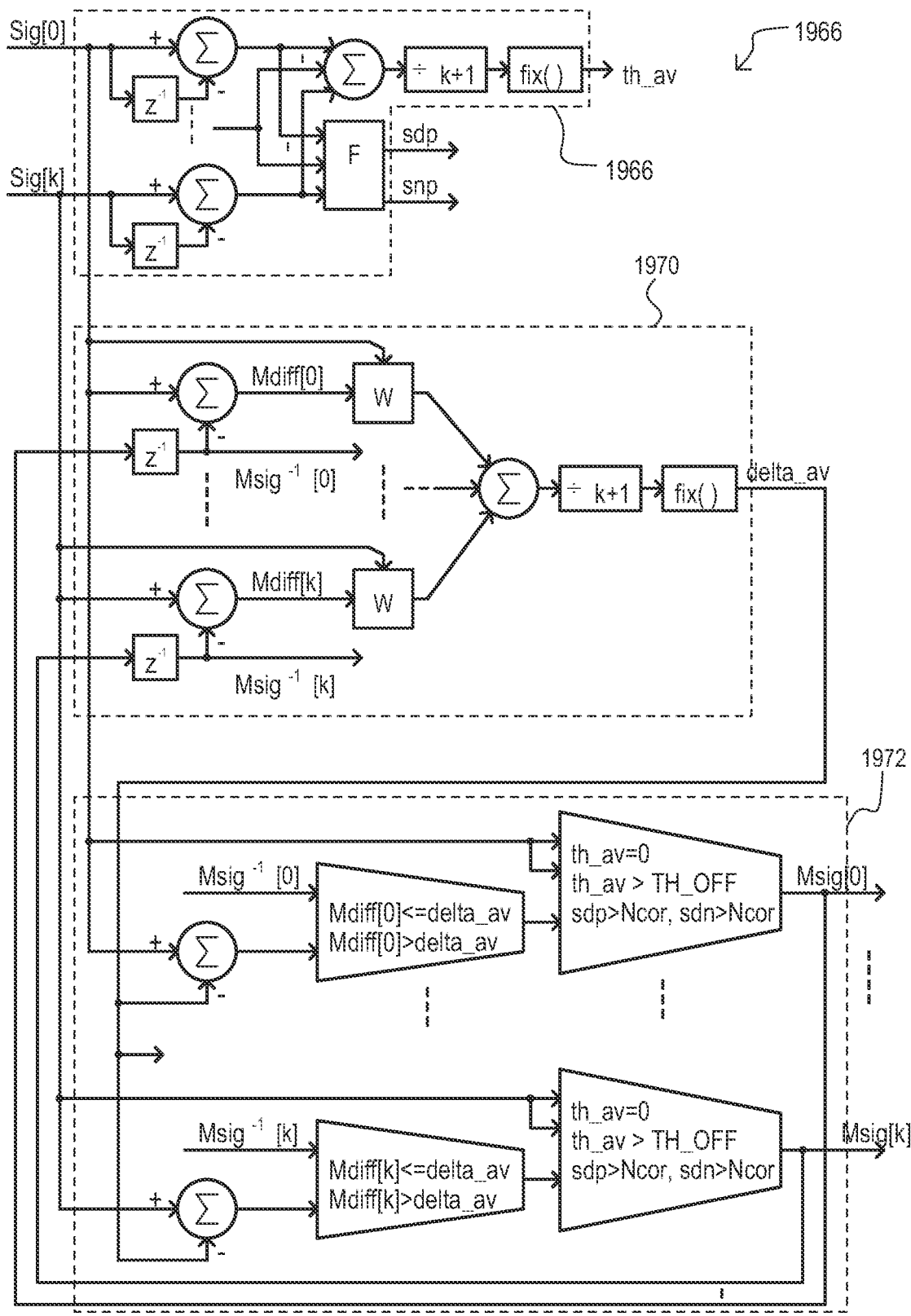
FIG. 19 is a diagram showing an AJF operation another to an embodiment.

FIG. 19 is a flow diagram showing another implementation of an AJF filter and weighting function like that shown in FIGS. 17A to 18B. FIG. 19 shows processing 1900 that includes a first section 1966 that can generate an average difference value (th_av), a positive disparity value (sdp), and negative disparity value (sdn), as described for FIG. 17A. A second section 1970 can generate a weighting value (delta_av) like that described for FIGS. 18A/B. A third section 1968 can generate filter output values as shown in FIG. 17B.

Figure 20:
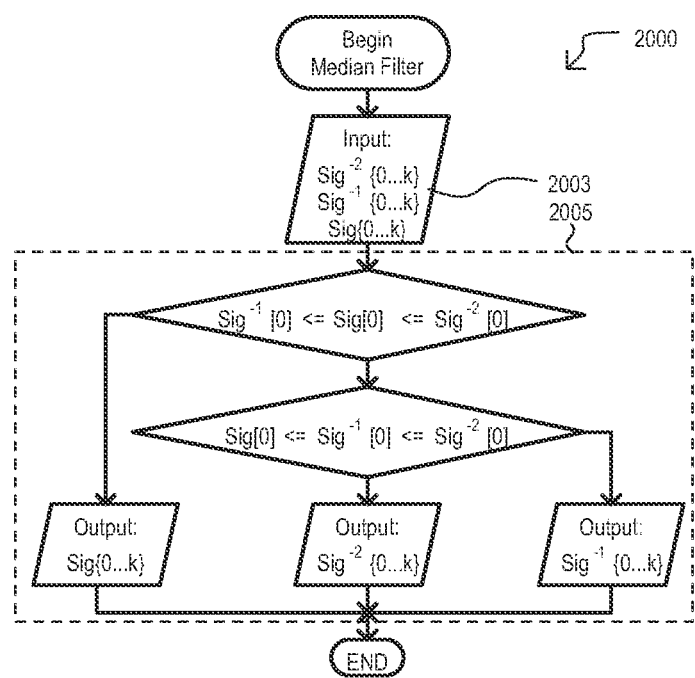
FIG. 20 is a flow diagram of a median filter that can be included in embodiments.

Referring now to FIG. 20, a median filter 2000 that can be included in the embodiments is shown in a flow diagram. A median filter 2000 can include inputting a set of sense values from consecutive sample periods (i.e., a sample window) (2003). In the particular embodiment of FIG. 20, a sample window is three. A median of the three values can be determined, and then provided as an output value (2005).

Embodiments can be utilized in capacitance sense systems to reduce the adverse affects of noise local to a subset of all electrodes, such as that arising from external noise sources.

Embodiments can improve capacitance sensing of a device when it is coupled to a charging device by filtering charger noise coupled to a touch object (e.g., finger).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:
1. A capacitance sensing system, comprising:
   a capacitance sense network comprising a plurality of electrodes for generating sense values;
   a power supply interface;
   a noise listening circuit configured to detect noise on a plurality of the electrodes, and vary its operation, including being enabled and disabled, in response to whether a power supply interface is or is not, respectively, receiving power from a source external to the capacitance sensing system; and a filtering circuit configured to provide first filtering to position detection signals output from the capacitance sense network when noise is detected by the noise listening circuit, and to provide second filtering to the position detection signals when noise is not detected by the noise listening circuit.

2. The capacitance sensing system of claim 1, wherein:
the capacitance sensing network comprises a mutual capacitance sensing circuit that senses a mutual capacitance between a plurality of transmit (TX) electrodes and a plurality of receive (RX) electrodes.

3. The capacitance sensing system of claim 2, wherein:
the capacitance sensing network comprises a switch circuit configured to connect one selected RX electrode to a capacitance sense circuit in a position detection mode, and a plurality of RX electrodes to the capacitance sense circuit in a noise detection mode.

4. The capacitance sensing system of claim 3, wherein:
the switch circuit is further configured to connect at least one selected TX electrode to a signal generator circuit in the position detection mode, and to ground the TX electrodes in the noise detection mode.

5. The capacitance sensing system of claim 3, wherein:
the switch circuit is further configured to connect at least one selected TX electrode to a signal generator circuit in the position detection mode, and a plurality of TX electrodes to the noise listening circuit in the noise detection mode.

6. The capacitance sensing system of claim 1, wherein:
the capacitance sense network generates the sense values by scanning a plurality of the electrodes; and
the filtering circuit is configured to operate on a first number of scans in the first filtering, and on a second number of scans in the second filtering, the first number being greater than the second number.

7. The capacitance sensing system of claim 6, wherein:
the filtering circuit comprises a common mode noise filter (CMF) and is configured to apply the CMF in the second filtering and not the first filtering.

8. The capacitance sensing system of claim 7, wherein:
the filtering circuit further comprises a median filter and a non-linear filter, the median filter and the non-linear filter being applied in the first filtering and not the second filtering.

9. A capacitance sensing system, comprising:
a touchscreen;
a mutual capacitance sense network coupled to the touchscreen and comprising a plurality of transmit (TX) electrodes and a plurality of receive (RX) electrodes;
a noise listening circuit configured to detect at least one noise source and vary its operation, including being enabled and disabled, in response to whether a power supply interface is or is not, respectively, receiving power from a source external to the capacitance sensing system; and
a controller configured to operate in a noise detection mode and a position detection mode, and including a switch circuit and a filtering circuit, wherein
in the noise detection mode, the switch circuit couples the electrodes of the sense network to a capacitance sensing circuit in a first configuration,
in the position detection mode, the switch circuit couples the electrodes of the sense network to the capacitance sensing circuit in a second configuration different than the first configuration; and
the filtering circuit is configured to provide first filtering to values generated from the sense network when the one noise source is detected by the noise listening circuit, and to provide second filtering to the position detection signals when the one noise source is not detected by the noise listening circuit.

10. The capacitance sensing system of claim 9, wherein:
in the noise detection mode, the switch circuit is configured to couple a plurality of RX electrodes simultaneously to the capacitance sensing circuit while simultaneously grounding the TX electrodes, and
in the position detection mode, the switch circuit is configured to apply an excitation signal to at least one TX electrode while sequentially coupling RX electrodes to the capacitance sensing circuit.

11. The capacitance sensing system of claim 9, wherein:
in the noise detection mode, the switch circuit is configured to couple a plurality of RX electrodes and TX electrodes simultaneously to the capacitance sensing circuit, and
in the position detection mode, the switch circuit is configured to apply an excitation signal to at least one TX electrode while sequentially coupling RX electrodes to the capacitance sensing circuit.

12. The capacitance sensing system of claim 9, wherein:
in the position detection mode, the switch circuit is configured to apply an excitation signal to at least one TX electrode while sequentially coupling RX electrodes to the capacitance sensing circuit, and
in the noise detection mode, the switch circuit is configured to sequentially couple RX electrodes to the capacitance sensing circuit, while not applying any excitation signal to any TX electrode.

13. The capacitance sensing system of claim 9, wherein:
in the position detection mode, the switch circuit is configured to apply an excitation signal to at least one TX electrode while sequentially coupling a number of N RX electrodes to the capacitance sensing circuit, where N is an integer of at least one, and
in the noise detection mode, the switch circuit is configured to sequentially couple a number of M RX electrodes to the capacitance sensing circuit, where M>N.

14. A method of filtering sense inputs of a touchscreen device, comprising:
selectively determining if a touchscreen with a mutual capacitance sensing network is receiving noise from at least one predetermined source with a noise listening circuit;
selectively varying an operation of the noise listening circuit, including being enabled or disabled, in response to whether the touchscreen device is or is not, respectively, receiving external power through a power supply interface;
if the noise is not being received, filtering capacitance sense input values generated from the sensing network with a common mode noise filter and a first number of scans of electrodes within the sensing network; and
if the noise is being received, filtering capacitance sense input values with filtering that does not include the common mode noise filter and with a second number of scans greater than the first number of scans.

15. The method of claim 14, wherein:
if the noise is being received, filtering capacitance sense input values with median filtering, and if the noise is not being received, filtering capacitance sense input values with filtering that does not include the median filtering.

16. The method of claim 14, wherein:
if the noise is being received, filtering capacitance sense input values with non-linear filtering, and
if the noise is not being received, filtering capacitance sense input values with filtering that does not include the non-linear filtering.

17. The method of claim 14, further including:
in a position detection mode, coupling electrodes of the sensing network to a capacitance sensing circuit in a first configuration; and
determining if the touchscreen is receiving noise from the at least one predetermined source includes coupling the electrodes to the capacitance sensing circuit in a second configuration different than the first configuration.

* * * * *